(12) United States Patent
Ouderkirk et al.

(10) Patent No.: US 7,312,560 B2
(45) Date of Patent: *Dec. 25, 2007

(54) PHOSPHOR BASED LIGHT SOURCES HAVING A NON-PLANAR LONG PASS REFLECTOR AND METHOD OF MAKING

(75) Inventors: Andrew J. Ouderkirk, Woodbury, MN (US); Michael F. Weber, Shoreview, MN (US); John A. Wheatley, Lake Elmo, MN (US)

(73) Assignee: 3M Innovative Properties, St. Paul, MN (US)

( * ) Notice: Subject to any disclaimer, the term of this patent is extended or adjusted under 35 U.S.C. 154(b) by 296 days.

This patent is subject to a terminal disclaimer.

(21) Appl. No.: 10/727,026

(22) Filed: Dec. 2, 2003

(65) Prior Publication Data

US 2004/0145895 A1 Jul. 29, 2004

Related U.S. Application Data

(60) Provisional application No. 60/443,274, filed on Jan. 27, 2003, provisional application No. 60/443,232, filed on Jan. 27, 2003, provisional application No. 60/443,235, filed on Jan. 27, 2003.

(51) Int. Cl.
*H01J 5/16* (2006.01)
*H01J 61/40* (2006.01)
*H01K 1/26* (2006.01)
*H01K 1/30* (2006.01)

(52) U.S. Cl. .................. 313/113; 313/502; 313/506; 313/512; 445/24; 445/26

(58) Field of Classification Search .............. 313/502, 313/503, 506, 512, 113; 257/98–100; 445/23, 445/24, 26, 27
See application file for complete search history.

(56) References Cited

U.S. PATENT DOCUMENTS

| 5,540,978 | A | 7/1996 | Schrenk |
| 5,540,987 | A | 7/1996 | Mudge et al. |
| 5,552,927 | A | 9/1996 | Wheatley et al. |
| 5,568,316 | A | 10/1996 | Schrenk et al. |
| 5,813,752 | A | 9/1998 | Singer et al. |

(Continued)

FOREIGN PATENT DOCUMENTS

DE 199 51 656 A1 8/2000

(Continued)

OTHER PUBLICATIONS

U.S. Appl. No. 60/407,426, Soules et al., "Coated LED With Improved Efficiency," filed Aug. 30, 2002.

(Continued)

*Primary Examiner*—Karabi Guharay
*Assistant Examiner*—Kevin Quarterman
(74) *Attorney, Agent, or Firm*—William D. Miller

(57) ABSTRACT

A light source including an LED that emits excitation light, a layer a phosphor material positioned to receive the excitation light, the phosphor material emitting visible light when illuminated with the excitation light, and a first non-planar flexible multilayer reflector that reflects the excitation light and transmits visible light. The non-planar flexible multilayer reflector is positioned to reflect LED light onto the phosphor material.

57 Claims, 9 Drawing Sheets

U.S. PATENT DOCUMENTS

| | | | |
|---|---|---|---|
| 5,813,753 A | 9/1998 | Vriens et al. | |
| 5,831,375 A | 11/1998 | Benson, Jr. | |
| 5,882,774 A | 3/1999 | Jonza et al. | |
| 6,010,751 A | 1/2000 | Shaw et al. | |
| 6,101,032 A | 8/2000 | Wortman et al. | |
| 6,155,699 A | 12/2000 | Miller et al. | |
| 6,172,810 B1 | 1/2001 | Fleming et al. | |
| 6,186,649 B1 | 2/2001 | Zou et al. | |
| 6,340,824 B1 | 1/2002 | Komoto et al. | |
| 6,366,018 B1 | 4/2002 | Garbuzov et al. | |
| 6,368,699 B1 | 4/2002 | Gilbert et al. | |
| 6,373,188 B1 | 4/2002 | Johnson et al. | |
| 6,404,125 B1 | 6/2002 | Garbuzov et al. | |
| 6,486,997 B1 | 11/2002 | Bruzzone et al. | |
| 6,501,091 B1 | 12/2002 | Bawendi et al. | |
| 6,504,301 B1 | 1/2003 | Lowery | |
| 6,506,480 B2 | 1/2003 | Liu et al. | |
| 6,515,785 B1 | 2/2003 | Cobb, Jr. et al. | |
| 6,521,329 B2 | 2/2003 | Aylward et al. | |
| 6,531,230 B1 | 3/2003 | Weber et al. | |
| 6,534,158 B2 | 3/2003 | Huang et al. | |
| 6,547,400 B1 | 4/2003 | Yokoyama | |
| 6,578,421 B1 | 6/2003 | Ishikawa et al. | |
| 6,601,962 B1 | 8/2003 | Ehara et al. | |
| 6,635,903 B2 | 10/2003 | Kato et al. | |
| 6,652,996 B2 | 11/2003 | Steklenski et al. | |
| 6,653,765 B1 | 11/2003 | Levinson et al. | |
| 6,686,676 B2 * | 2/2004 | McNulty et al. | 313/112 |
| 6,717,348 B2 | 4/2004 | Takahashi | |
| 6,744,077 B2 | 6/2004 | Trottier et al. | |
| 6,833,565 B2 | 12/2004 | Su et al. | |
| 2001/0001207 A1 | 5/2001 | Shimizu et al. | |
| 2001/0013668 A1 | 8/2001 | Neavin et al. | |
| 2002/0017651 A1 | 2/2002 | Kato et al. | |
| 2002/0043926 A1 | 4/2002 | Takahashi et al. | |
| 2002/0054406 A1 | 5/2002 | Duerksen | |
| 2002/0063520 A1 | 5/2002 | Yu et al. | |
| 2002/0079837 A1 | 6/2002 | Okazaki | |
| 2002/0084748 A1 | 7/2002 | Ayala et al. | |
| 2002/0084749 A1 | 7/2002 | Ayala et al. | |
| 2002/0085601 A1 | 7/2002 | Wang et al. | |
| 2002/0121645 A1 | 9/2002 | Yasukawa et al. | |
| 2002/0140880 A1 | 10/2002 | Weindorf et al. | |
| 2002/0154406 A1 | 10/2002 | Merrill et al. | |
| 2002/0180351 A1 | 12/2002 | McNulty et al. | |
| 2003/0002272 A1 | 1/2003 | Suehiro et al. | |
| 2003/0038295 A1 | 2/2003 | Koda | |
| 2003/0165060 A1 * | 9/2003 | Ouderkirk et al. | 362/297 |
| 2003/0217806 A1 | 11/2003 | Tait et al. | |
| 2004/0116033 A1 | 6/2004 | Ouderkirk et al. | |
| 2004/0144987 A1 * | 7/2004 | Ouderkirk et al. | 257/98 |
| 2004/0145288 A1 | 7/2004 | Ouderkirk et al. | |
| 2004/0145289 A1 | 7/2004 | Ouderkirk et al. | |
| 2004/0145312 A1 | 7/2004 | Ouderkirk et al. | |
| 2004/0145913 A1 | 7/2004 | Ouderkirk et al. | |
| 2004/0149998 A1 | 8/2004 | Henson et al. | |
| 2004/0150991 A1 | 8/2004 | Ouderkirk et al. | |
| 2004/0150997 A1 | 8/2004 | Ouderkirk et al. | |
| 2004/0159900 A1 | 8/2004 | Ouderkirk et al. | |

FOREIGN PATENT DOCUMENTS

| | | |
|---|---|---|
| EP | 0733919 A2 | 9/1996 |
| EP | 0795941 A1 | 9/1997 |
| EP | 1 119 058 A1 | 7/2001 |
| GB | 2 373 368 A | 9/2002 |
| JP | 11274572 | 10/1999 |
| JP | 2004031843 | 1/2004 |
| WO | WO 97/01778 | 1/1997 |
| WO | WO 97/10278 | 3/1997 |
| WO | WO 97/48138 | 12/1997 |
| WO | WO 99/36248 | 7/1999 |
| WO | WO 99/60303 | 11/1999 |
| WO | WO 01/39286 | 5/2001 |
| WO | WO 01/75490 | 10/2001 |
| WO | WO 02/37568 | 5/2002 |
| WO | WO 03/029722 | 4/2003 |
| WO | WO 2004/021461 | 3/2004 |

OTHER PUBLICATIONS

U.S. Appl. No. 10/726,244; Simbal, John J.; "Reflective Light Coupler"; filed Dec. 2, 2003.

U.S. Appl. No. 10/727,220; Schultz, John C.; "Illumination Assembly"; filed Dec. 2, 2003.

U.S. Appl. No. 10/726,225; Henson, Gordon D.; "Solid State Light Device"; filed Dec. 2, 2003.

U.S. Appl. No. 10/726,248; Watson, James E.; "Multiple LED Source and Method for Assembling Same"; filed Dec. 2, 2003.

U.S. Appl. No. 10/739,792; Ouderkirk, Andrew J.; "Display Including a Solid State Light Device and Method Using Same"; filed Dec. 18, 2003.

U.S. Appl. No. 10/726,257; Aguirre, Francis M.; "LED Curing Apparatus and Method"; filed Dec. 2, 2003.

Weber et al., "Giant Birefringent Optics in Multilayer Polymer Mirrors", Science, vol. 287, Mar. 31, 2000, pp. 2451-2456.

Mueller, "White Light Emitting Diodes," Intertech '03, 22 pages.

Haaren et al., "Recent Advances in Displays for Portable Products", ASET International Display Forum on Low Power Displays, Jul. 21, 2000, Tokyo (Japan), pp. 1-6, XP-002289713.

Office Action for U.S. Appl. No. 10/727,072, mailed on Sep. 15, 2005.

Amendment and Response to Office Action for U.S. Appl. No. 10/727,072, dated Dec. 15, 2005.

Inquiry Documents, 54 pages, 2001.

* cited by examiner

PHOSPHOR BASED LIGHT SOURCES HAVING A NON-PLANAR LONG PASS REFLECTOR AND METHOD OF MAKING

CROSS-REFERENCE

This application claims the benefit of U.S. Provisional Application Nos. 60/443,274, 60/443,232, and 60/443,235 all filed 27 Jan. 2003, and all incorporated by reference herein.

RELATED PATENT APPLICATIONS

The following co-owned and concurrently filed U.S. patent applications are incorporated herein by reference: "PHOSPHOR BASED LIGHT SOURCES HAVING A POLYMERIC LONG PASS REFLECTOR", Ser. No. 10/726,997; "METHODS OF MAKING PHOSPHOR BASED LIGHT SOURCES HAVING AN INTERFERENCE REFLECTOR", Ser. No. 10/727,023; "PHOSPHOR BASED LIGHT SOURCE COMPONENT AND METHOD OF MAKING", Ser. No. 10/726,790; "PHOSPHOR BASED LIGHT SOURCE HAVING A FLEXIBLE SHORT PASS REFLECTOR", Ser. No. 10/726,995; "PHOSPHOR BASED LIGHT SOURCES HAVING A NON-PLANAR LONG PASS REFLECTOR", Ser. No. 10/727,072; and "PHOSPHOR BASED LIGHT SOURCES HAVING A NON-PLANAR SHORT PASS REFLECTOR AND METHOD OF MAKING", Ser. No. 10/726,968.

FIELD OF THE INVENTION

The present invention relates to light sources. More particularly, the present invention relates to light sources in which light emitted from a light emitting diode (LED) impinges upon and excites a phosphor material, which in turn emits visible light.

DISCUSSION

White light sources that utilize LEDs in their construction can have two basic configurations. In one, referred to herein as direct emissive LEDs, white light is generated by direct emission of different colored LEDs. Examples include a combination of a red LED, a green LED, and a blue LED, and a combination of a blue LED and a yellow LED. In the other basic configuration, referred to herein as LED-excited phosphor-based light sources (PLEDs), a single LED generates a beam in a narrow range of wavelengths, which beam impinges upon and excites a phosphor material to produce visible light. The phosphor can comprise a mixture or combination of distinct phosphor materials, and the light emitted by the phosphor can include a plurality of narrow emission lines distributed over the visible wavelength range such that the emitted light appears substantially white to the unaided human eye.

An example of a PLED is a blue LED illuminating a phosphor that converts blue to both red and green wavelengths. A portion of the blue excitation light is not absorbed by the phosphor, and the residual blue excitation light is combined with the red and green light emitted by the phosphor. Another example of a PLED is an ultraviolet (UV) LED illuminating a phosphor that absorbs and converts UV light to red, green, and blue light.

Advantages of white light PLEDs over direct emission white LEDs include better color stability as a function of device aging and temperature, and better batch-to-batch and device-to-device color uniformity/repeatability. However, PLEDs can be less efficient than direct emission LEDs, due in part to inefficiencies in the process of light absorption and re-emission by the phosphor.

A white light PLED can comprise a UV emitting semiconductor die (chip) in a reflective heat sink. The reflective heat sink can also serve to partially collimate the UV light. The UV light illuminates the underside of a phosphor-containing layer, which absorbs at least a portion of the UV light and emits light at multiple wavelengths in the visible region to provide a source appearing substantially white to the ordinary observer. FIG. 1 shows one configuration of such a PLED 10. The PLED includes a semiconducting LED 12 mounted in a well of an electrically conductive heat sink 14 that also reflects some of the light emitted from LED 12 toward a phosphor-reflector assembly 16. The assembly 16 can reside in an optically transparent potting material 18 which can be shaped to provide a lens feature 20 to tailor the light emitted by PLED 10. The phosphor assembly 16 is shown in greater detail in FIG. 2. The phosphor is formed into a layer 22 from a combination of one or more phosphor materials mixed with a binder. A long-pass (LP) reflector 24, that reflects the UV excitation light but transmits the visible emitted light, can be applied to the top surface of phosphor layer 22. A short-pass (SP) reflector 26, that reflects visible light but transmits UV light, can be applied to the bottom of layer 22.

The optimum thickness of the phosphor layer for a given phosphor concentration is a compromise between efficiently absorbing the UV light (favoring an optically thick phosphor layer) and efficiently emitting visible light (favoring an optically thin phosphor layer). Further, since the intensity of UV light is greatest at the bottom of phosphor layer 22, and useful light is being extracted from the top of phosphor layer 22, increasing the thickness of phosphor layer 22 above the optimum thickness will rapidly reduce overall PLED output and efficiency.

The presence of LP reflector 24 and SP reflector 26 can enhance the efficiency of PLED 10. The LP reflector 24 reflects the UV light that is not absorbed by phosphor layer 22, and that would otherwise be wasted, back onto the phosphor layer 22. This increases the effective path length of the UV light through the phosphor layer, increasing the amount of UV light absorbed by the phosphor for a given phosphor layer thickness. The optimum phosphor layer thickness can thus be reduced compared to a construction without LP reflector 24, increasing the efficiency of light generation.

Another significant loss in the PLED is due to the directionally uncontrolled generation of light in the phosphor layer, resulting in half of the visible light generated in phosphor layer 22 being directed back towards the LED. Some of this light can be captured by reflection off the sloped walls of the heat sink, but much of the light is scattered, absorbed, or reduced in quality. This loss can be reduced by placing SP reflector 26 as shown between LED 12 and phosphor layer 22.

It would be advantageous to even further enhance the efficiency of PLED constructions. It would also be advantageous to simplify and reduce the cost of manufacture of PLEDs.

BRIEF SUMMARY

The present application discloses PLEDs that utilize polymer multilayer optical films for the filtering components, i.e., the LP and SP reflectors. The multilayer optical films include individual optical layers, at least some of which are birefringent, arranged into optical repeat units through the thickness of the film. Adjacent optical layers have refractive index relationships that maintain reflectivity and avoid leakage of p-polarized light at moderate to high incidence angles. The SP reflector comprises optical repeat units having a thickness gradient that produces a reflection band positioned to reflect visible light emitted by the phosphor and transmit UV excitation light. The LP reflector comprises optical repeat units having a different thickness gradient that produces a reflection band positioned to reflect the UV excitation light and transmit the visible light emitted by the phosphor. As a component of the PLED, the polymer multilayer optical film(s) can have a flat configuration or at least one can be embossed or otherwise shaped to be curved, whether in the shape of a sphere, paraboloid, ellipsoid, or other shape.

Methods of manufacturing PLEDs are disclosed, which methods include forming a sheet material that includes at least one polymer multilayer optical film and a phosphor layer. In some cases the phosphor can be sandwiched between two polymer multilayer optical films: one SP reflector, and one LP reflector. In other cases the phosphor layer can be applied to only one polymer multilayer optical film. The polymer multilayer optical film(s) and phosphor layer form a phosphor-reflector assembly. Individual pieces of the phosphor-reflector assembly can be cut from the sheet material and subsequently immersed in a transparent potting material or injection-molded to form a first optical component which is then coupled to a separately manufactured LED component. The sheet material can include a carrier film to hold and store the phosphor-reflector assembly pieces in a convenient roll form until needed. The PLED can be made by joining a lower portion comprising the LED to an upper portion comprising a phosphor-reflector assembly. Also in some cases the sheet material can be embossed The present specification discloses PLED embodiments in which a curved LP reflector is spaced apart from the phosphor layer, or at least from a central bright portion thereof, so that any UV excitation light not absorbed by the phosphor layer will impinge on the LP reflector over a limited range of incidence angles and be more efficiently reflected back onto the phosphor layer.

The present application discloses PLED embodiments that utilize an air gap proximate at least one of the multilayer optical films and the phosphor layer to promote total internal reflection.

The present application discloses PLED embodiments that utilize combinations of non-imaging concentrator elements to enhance the performance of the LP and/or SP reflector.

The present application also discloses PLED embodiments in which the LED, the LP reflector, and the phosphor layer are arranged such that excitation light from the LED is reflected directly onto a front major surface of the phosphor layer.

These and other aspects of disclosed embodiments will be apparent from the detailed description below. In no event, however, should the above summaries be construed as limitations on claimed subject matter, which subject matter is defined solely by the attached claims, as may be amended during prosecution.

BRIEF DESCRIPTION OF THE DRAWINGS

Throughout the specification, reference is made to the appended drawings, where like reference numerals designate like elements, and wherein.

DETAILED DESCRIPTION OF ILLUSTRATIVE EMBODIMENTS

Figure 1:
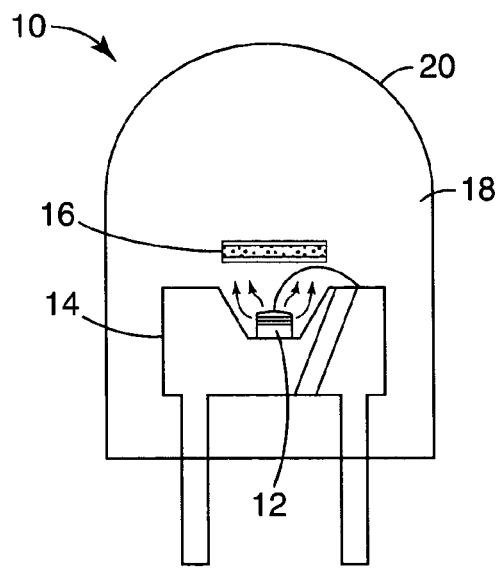
FIG. 1 is a schematic sectional view of a LED-excited phosphor-based light source (PLED)
Figure 2:
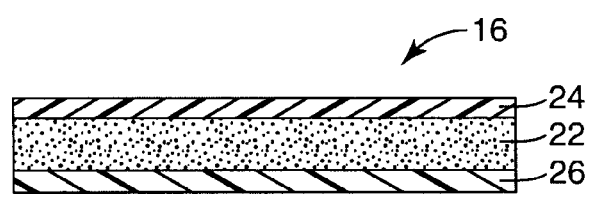
FIG. 2 is a sectional view of a phosphor-reflector assembly used in the source of FIG. 1.

While the use of one or both of LP reflector 24 and SP reflector 26 as shown in FIGS. 1-2 can improve system efficiency, the improvement is limited due to certain reflectors poor spectral selectivity and poor reflectivity at oblique angles of incidence. LP mirrors or filters based on scattering processes can achieve relatively constant performance as a function of incidence angle, but have poor spectral selectivity. LP and SP mirrors constructed from an inorganic dielectric material stack can have good spectral selectivity over a narrow range of incidence angles, but suffer from spectral blue-shifts with increasing incidence angle and low reflectivity (high transmission) of p-polarized light at moderate to high incidence angles. Since phosphor particles scatter the UV excitation light, and emit their own light over a wide range of angles, conventional LP and SP mirrors are not highly effective in managing light within the phosphor-reflector assembly.

The performance of PLEDs can be increased by using polymeric multilayer optical films, i.e., films having tens, hundreds, or thousands of alternating layers of at least a first and second polymer material, whose thicknesses and refractive indices are selected to achieve a desired reflectivity in a desired portion of the spectrum, such as a reflection band limited to UV wavelengths or a reflection band limited to visible wavelengths. See, for example, U.S. Pat. No. 5,882,774 (Jonza et al.). Although reflection bands produced by these films also experience a blue-shift with incidence angle similar to the blue-shift associated with stacks of inorganic isotropic materials, the polymeric multilayer optical films can be processed so that adjacent layer pairs have matching or near-matching, or deliberately mismatched refractive indices associated with a z-axis normal to the film such that the reflectivity of each interface between adjacent layers, for p-polarized light, decreases slowly with angle of incidence, is substantially independent of angle of incidence, or increases with angle of incidence away from the normal. Hence, such polymeric multilayer optical films can maintain high reflectivity levels for p-polarized light even at highly oblique incidence angles, reducing the amount of p-polarized light transmitted by the reflective films compared to conventional inorganic isotropic stack reflectors. In order to achieve these properties, the polymer materials and processing conditions are selected so that, for each pair of adjacent optical layers, the difference in refractive index along the z-axis (parallel to the thickness of the film) is no more than a fraction of the refractive index difference along the x- or y-(in-plane) axes, the fraction being 0.5, 0.25, or even 0.1. Alternatively, the refractive index difference along the z-axis can be opposite in sign to the in-plane refractive index differences.

The use of polymeric multilayer optical films also makes available a variety of new PLED embodiments and methods of construction due to the flexibility and formability of such films, whether or not they also have the refractive index relationships referred to above. For example, polymeric multilayer optical film can be permanently deformed by embossing, thermoforming, or other known means to have a 3-dimensional shape such as a portion of a paraboloid, a sphere, or an ellipsoid. See generally published application US 2002/0154406 (Merrill et al.). See also U.S. Pat. No. 5,540,978 (Schrenk) for additional polymeric multilayer film embodiments. Unlike conventional inorganic isotropic stacks, which are normally vapor deposited layer-by-layer onto a rigid, brittle substrate, polymeric multilayer optical films can be made in high volume roll form, and can also be laminated to other films and coated, and can be die cut or otherwise subdivided into small pieces for easy incorporation into an optical system such as a PLED as further explained below. Suitable methods of subdividing polymeric multilayer optical film are disclosed in pending U.S. application Ser. No. 10/268,118, filed Oct. 10, 2002.

A wide variety of polymer materials are suitable for use in multilayer optical films for PLEDs. However, particularly where the PLED comprises a white-light phosphor emitter coupled with a UV LED excitation source, the multilayer optical film preferably comprises alternating polymer layers composed of materials that resist degradation when exposed to UV light. In this regard, a particularly preferred polymer pair is polyethylene terephthalate (PET)/co-polymethylmethacrylate (co-PMMA). The UV stability of polymeric reflectors can also be increased by the incorporation of non-UV absorbing light stabilizers such as hindered amine light stabilizers (HALS). In some cases the polymeric multilayer optical film can also include transparent metal or metal oxide layers. See e.g. PCT Publication WO 97/01778 (Ouderkirk et al.). In applications that use particularly high intensity UV light that would unacceptably degrade even robust polymer material combinations, it may be beneficial to use inorganic materials to form the multilayer stack. The inorganic material layers can be isotropic, or can be made to exhibit form birefringence as described in PCT Publication WO 01/75490 (Weber) and thus have the beneficial refractive index relationships that yield enhanced p-polarization reflectivity as described above. However, in most cases it is most convenient and cost effective for the multilayer optical film to be substantially completely polymeric, free of inorganic materials.

Figure 3:
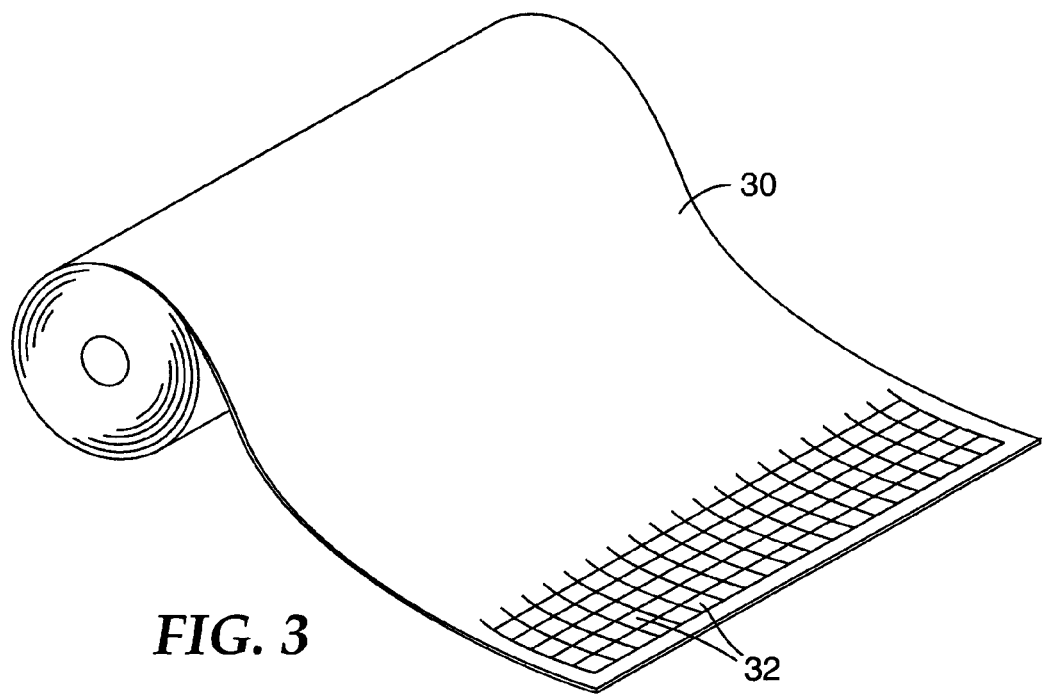
FIG. 3 depicts a roll comprising a phosphor-reflector assembly in sheet form and subdivided into individual pieces.
Figure 4:
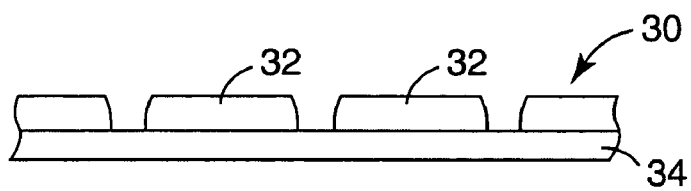
FIG. 4 is a schematic sectional view illustrating individual pieces of the phosphor-reflector assembly on a carrier film.

FIG. 3 depicts a roll of sheet material 30, which material comprises at least one polymeric multilayer optical film and a substantially uniform phosphor layer applied to the multilayer optical film by a coating operation. The sheet material can also comprise a second polymeric multilayer optical film applied in such a way that the phosphor layer is sandwiched between the first and second polymeric multilayer optical film, as seen in FIG. 2. Additional layers and coatings providing desired mechanical, chemical, and/or optical properties can also be included. See U.S. Pat. No. 6,368,699 (Gilbert et al.). The sheet material 30 also preferably includes a carrier film. The sheet material is kiss-cut by mechanical means such as a knife, precision die cutting, or by scanning laser radiation as described in the pending '118 application referred to above. The kiss-cut lines define discrete pieces 32 of the sheet material, but exclusive of the carrier film which remains intact. The pieces 32 can have a cross-sectional construction similar to that shown in FIG. 2, and can be of arbitrarily small size. They are conveniently carried by the underlying carrier film 34 as shown in FIG. 4. During production of the PLEDs—and independent of the construction of the LED source—pieces 32 can be removed from the carrier film and placed in individual molds to which potting material is, or was previously, added, thus forming PLEDs as depicted in FIG. 1 but wherein the reflector components use polymeric multilayer optical films.

Figure 5:
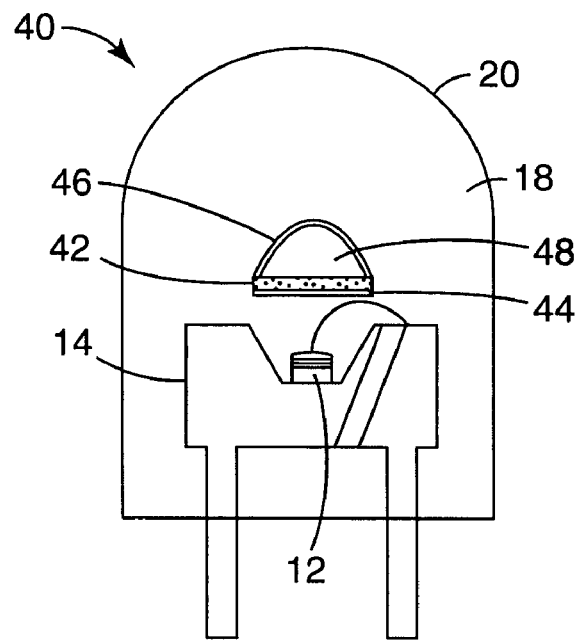
FIGS. 5-7 are schematic sectional views of alternative PLED constructions.
Figure 6:
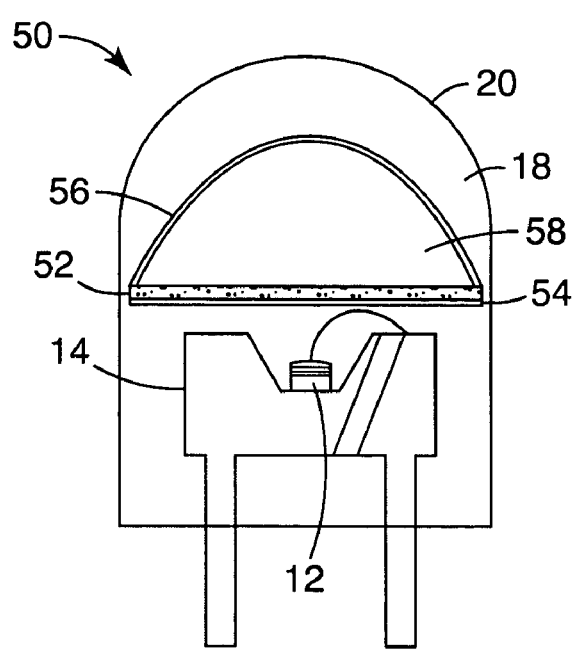
Figure 7:
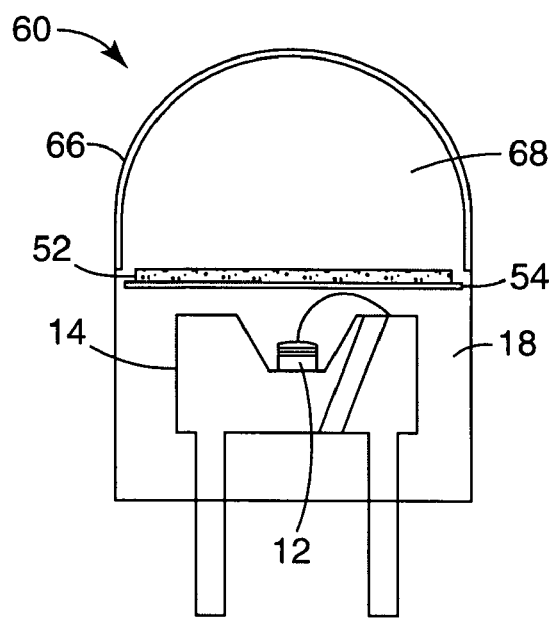

FIGS. 5-7 depict alternative constructions of PLEDs utilizing a concave-shaped multilayer optical film LP reflector. Spacing the LP reflector away from the phosphor and curving it in towards the phosphor and towards the LED 12 helps reduce the range of incidence angles of excitation light impinging on the LP reflector, thereby reducing the leakage of UV light through the LP reflector caused by the blue-shift effect discussed above. Preferably the multilayer optical film is permanently deformed by embossing or other suitable process into a concave surface of suitable shape before immersion in transparent medium 18. The multilayer optical films, whether LP or SP, are specular reflectors within their respective reflection bands. Diffuse reflection from a multilayer optical film is typically negligible.

In FIG. 5, PLED 40 includes a relatively small area phosphor layer 42 disposed on an optional SP reflector 44 composed of a polymeric multilayer optical film. LP reflector 46 has been embossed to acquire a concave shape and positioned next to the other components (42, 44) of the phosphor-reflector assembly. LED 12 and heat sink 14 are arranged to direct UV excitation light emitted by the LED toward the central portion of phosphor layer 42. Preferably, the UV light has its highest fluence at or near the center of phosphor layer 42. UV light not absorbed in its initial traversal of phosphor layer 42 passes through a region 48 between LP reflector 46 and phosphor layer 42 before being reflected by LP reflector 46 back towards the phosphor layer. The region 48 can be composed of transparent potting material 18, or alternatively of another polymeric material, or air (or other gas), or glass. LP reflector 46 is preferably shaped to maximize the amount of UV excitation light reflected back to the phosphor.

FIG. 6 shows a PLED 50 similar to PLED 40, except that the size of the phosphor layer 52, SP reflector 54, and LP reflector 56 are increased. For a given distance from LED 12 to the phosphor layer, and the same heat sink 14 geometry, the larger LP reflector 56 will yield a higher concentration of light in the center of the phosphor layer. The smaller, central emitting area of the phosphor layer presents a smaller range of incidence angles of phosphor-emitted light to the surface of the LP reflector, improving overall PLED efficiency. As before, region 58 can be composed of potting material 18 or another polymeric material, or air (or other gas), or glass.

PLED 60, shown in FIG. 7, is similar to PLED 50, except the LP reflector 66 now forms an outer surface of the light source. Region 68 can be filled with potting material 18 or other transparent medium.

The phosphor layers of FIGS. 5-7 can be continuous, or patterned to limit the phosphor to where it is most effective. Moreover, in the embodiments of FIGS. 1 and 5-7 and other embodiments where the phosphor-reflector assembly is disposed above and spaced apart from the LED, the PLED can be manufactured in two halves: one containing the LED with heat sink, and the other containing the phosphor layer and multilayer reflector(s). The two halves can be made separately, and then be joined or otherwise secured together. This construction technique can help simplify manufacturing and increase overall yields.

Figure 8:
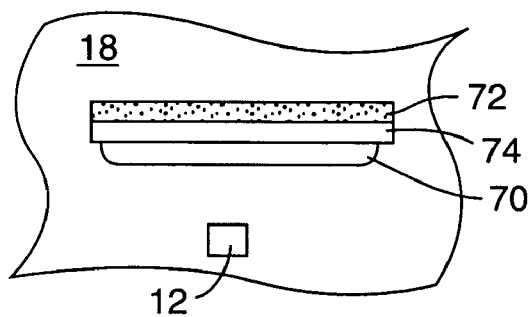
FIG. 8 depicts a portion of still another PLED construction.

FIG. 8 demonstrates a concept that can be applied beneficially to the other embodiments herein: providing an air gap between the LED and the phosphor layer, and/or providing an air gap proximate to one or more elements of the phosphor-reflector assembly. Only some elements of a PLED are shown in the figure for simplicity of description. An air gap 70 is shown between LED 12 and phosphor layer 72, adjacent multilayer optical film SP reflector 74. The air gap has a minimal detrimental effect on UV light from the LED reaching the phosphor layer because of the relatively small angles involved. But the air gap enables total internal reflection (TIR) of light traveling at high incidence angles, such as light traveling in the SP reflector, the phosphor layer, and the LP reflector. In the embodiment of FIG. 8 the efficiency of the SP reflector is enhanced by allowing TIR at the lower surface of reflector 74. Alternatively, SP reflector 74 can be eliminated and the air gap can be formed directly under phosphor layer 72. An air gap can also be formed at the upper side of phosphor layer 72, or adjacent to the LP reflector at its upper or lower surface. One approach for providing the air gap involves the use of known microstructured films. Such films have a substantially flat surface opposed to a microstructured surface. The microstructured surface can be characterized by a single set of linear v-shaped grooves or prisms, multiple intersecting sets of v-shaped grooves that define arrays of tiny pyramids, one or more sets of narrow ridges, and so forth. When the microstructured surface of such a film is placed against another flat film, air gaps are formed between the uppermost portions of the microstructured surface.

As phosphors convert light of one wavelength (the excitation wavelength) to other wavelengths (the emitted wavelengths), heat is produced. The presence of an air gap near the phosphor may significantly reduce heat transmission from the phosphor to surrounding materials. The reduced heat transfer can be compensated for in other ways, such as by providing a layer of glass or transparent ceramic near the phosphor layer that can remove heat laterally.

Figure 9:
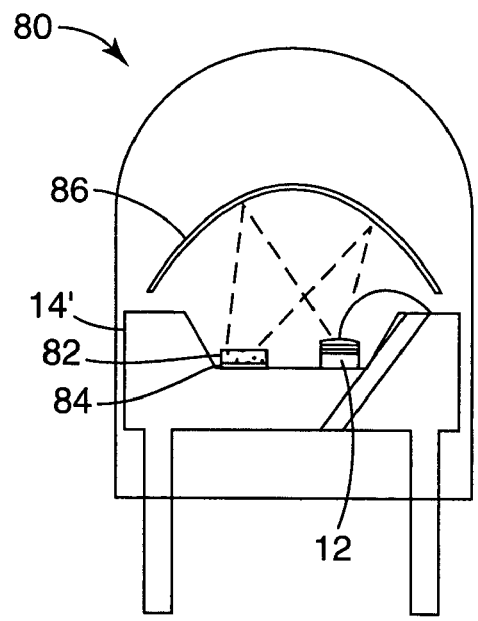
FIG. 9 is a schematic sectional view of still another PLED construction.

Still another approach of improving the efficiency of PLEDs is to configure the LED, phosphor layer, and LP reflector such that at least some of the UV light from the LED is reflected by the LP reflector directly onto the top (viewing) surface of the phosphor layer, rather than directing all of the UV light onto the bottom surface of the phosphor layer. FIG. 9 shows such a PLED 80. The heat sink 14' has been modified from above embodiments so that the LED 12 and the phosphor layer 82 can be mounted generally coplanar. An SP reflector 84 is shown underneath the phosphor layer, but in many cases will not be required. This is because LP reflector 86, which has been embossed in the form of a concave ellipsoid or similar shape, directs UV excitation light directly from the LED onto the upper surface of phosphor layer 82, which surface faces the front of PLED 80. The LED and phosphor layer are preferably disposed at the foci of the ellipsoid. The visible light emitted by the phosphor layer is transmitted by LP reflector 86 and collected by the rounded front end of the PLED body to form the desired pattern or visible (preferably white) light Directing excitation light directly at the front surface of the phosphor layer has a number of benefits. The brightest portion of the phosphor layer—where the excitation light is the strongest—now is exposed at the front of the device rather than being obscured through the thickness of the phosphor layer. The phosphor layer can be made substantially thicker so that it absorbs substantially all of the UV excitation light, without concern for the thickness/brightness tradeoff referred to above. The phosphor can be mounted on a broadband metal mirror, including silver or enhanced aluminum.

Figure 10:
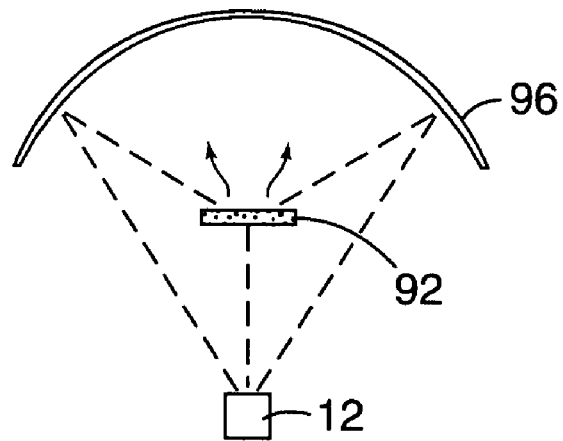
FIG. 10 is a schematic side view of another PLED construction that utilizes front surface illumination, as does the embodiment of FIG. 9.

FIG. 10 shows schematically another PLED embodiment where the LED light impinges on the front surface of the phosphor layer, but wherein some of the LED light also impinges on the back surface. In this embodiment, some light emitted by LED 12 impinges on the back surface of phosphor layer 92, but some LED light also reflects off of the concave-shaped LP reflector 96 to strike the front surface of phosphor layer 92 without traversing through the phosphor. Visible light emitted by phosphor layer 92 then passes through the LP reflector 96 towards the viewer or object to be illuminated. The LED, phosphor layer, and LP reflector can all be immersed or attached to a transparent potting medium as shown in previous embodiments.

Figure 11:
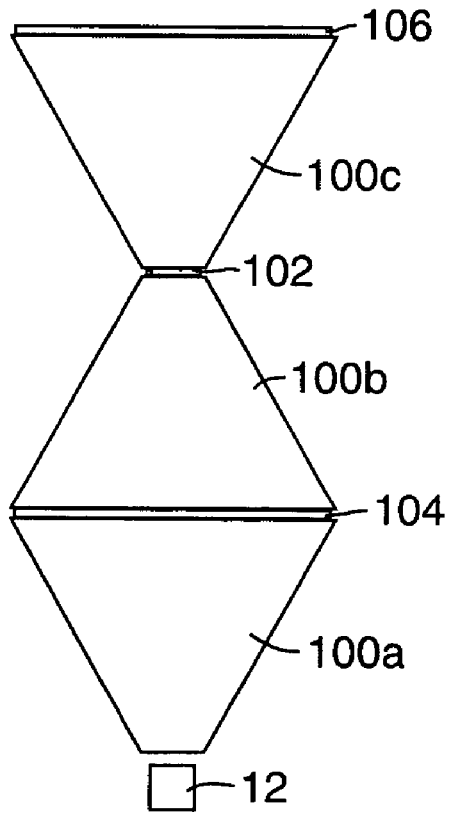
FIG. 11 is a schematic side view of a PLED construction that makes use of an arrangement of nonimaging concentrators.

FIG. 11 shows schematically another PLED embodiment, wherein combinations of non-imaging concentrators are arranged to enhance the operation of the multilayer optical films. Specifically, concentrator elements 100a, 100b, 100c are provided as shown between the LED 12, SP reflector 104, phosphor layer 102, and LP reflector 106. The concentrator elements have the effect of reducing the angular spread of light impinging on the multilayer reflectors, thus reducing the blue-shift of the reflection band discussed above in connection with FIGS. 5-7. The concentrator elements may be in the form of simple conical sections with flat sidewalls, or the sidewalls can take on a more complex curved shape as is known to enhance collimation or focusing action depending on the direction of travel of the light. In any event the sidewalls of the concentrator elements are reflective and the two ends (one small, one large) are not. In FIG. 11, LED 12 is disposed at the small end of concentrator 100a. Concentrator element 100a collects a wide angular range of light emitted by the LED, which range is reduced by the time such light has traveled to the large end of concentrator element 100a, where SP reflector 104 is mounted. The SP reflector transmits the UV excitation light to concentrator element 100b, which concentrates such light onto phosphor layer 102 (while increasing the angular spread of the light). Wide angular range visible light emitted downwardly by phosphor layer 102 is converted by concentrator element 100b to a more narrow angular range at SP reflector 104, where it is reflected back up towards the phosphor layer 102. Meanwhile, UV light that leaks through phosphor layer 102 and visible light emitted upwardly by phosphor layer 102 initially has a wide angular spread, but is converted by concentrator element 100c to a smaller angular spread so that LP reflector 106 will better transmit the visible light emitted by the phosphor and reflect the UV light back towards the phosphor layer.

Figure 12:
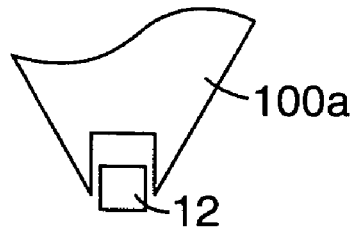
FIG. 12 is a close-up view of a portion of FIG. 11.

To capture as much LED excitation light as possible, the small end of concentrator element 100a can have a cavity so as to capture at least some light emitted by the sides of the LED, as shown in FIG. 12.

The embodiments disclosed herein are operative with a variety of phosphor materials. The phosphor materials are typically inorganic in composition, having excitation wavelengths in the 300-450 nanometer range and emission wavelengths in the visible wavelength range. In the case of phosphor materials having a narrow emission wavelength range, a mixture of phosphor materials can be formulated to achieve the desired color balance, as perceived by the viewer, for example a mixture of red-, green- and blue-emitting phosphors. Phosphor materials having broader emission bands are useful for phosphor mixtures having higher color rendition indices. Desirably, phosphors should have fast radiative decay rates. A phosphor blend can comprise phosphor particles in the 1-25 micron size range dispersed in a binder such as epoxy, adhesive, or a polymeric matrix, which can then be applied to a substrate, such as an LED or a film. Phosphors that convert light in the range of about 300 to 470 nm to longer wavelengths are well known in the art. See, for example, the line of phosphors offered by Phosphor Technology Ltd., Essex, England. Phosphors include rare-earth doped garnets, silicates, and other ceramics. The term "phosphor" as used herein can also include organic fluorescent materials, including fluorescent dyes and pigments. Materials with high stability under 300-470 nm radiation are preferred, particularly inorganic phosphors.

Glossary of Certain Terms

LED: a diode that emits light, whether visible, ultraviolet, or infrared, and whether coherent or incoherent. The term as used herein includes incoherent (and usually inexpensive) epoxy-encased semiconductor devices marketed as "LEDs", whether of the conventional or super-radiant variety. The term as used herein also includes semiconductor laser diodes.

Visible Light: light that is perceptible to the unaided human eye, generally in the wavelength range from about 400 to 700 nm.

Optical Repeat Unit ("ORU"): a stack of at least two individual layers which repeats across the thickness of a multilayer optical film, though corresponding repeating layers need not have the same thickness.

Optical thickness: the physical thickness of a given body times its refractive index. In general, this is a function of wavelength and polarization.

Reflection band: a spectral region of relatively high reflectance bounded on either side by regions of relatively low reflectance.

Ultraviolet (UV): light whose wavelength is in the range from about 300 to about 400 nm.

White light: light that stimulates the red, green, and blue sensors in the human eye to yield an appearance that an ordinary observer would consider "white". Such light may be biased to the red (commonly referred to as warm white light) or to the blue (commonly referred to as cool white light). Such light can have a color rendition index of up to 100.

Further Discussion

The interference reflector described herein includes reflectors that are formed of organic, inorganic or a combination of organic and inorganic materials. The interference reflector can be a multilayer interference reflector. The interference reflector can be a flexible interference reflector. A flexible interference reflector can be formed from polymeric, non-polymeric materials, or polymeric and non-polymeric materials. Exemplary films including a polymeric and non-polymeric material are disclosed in U.S. Pat. Nos. 6,010,751 and 6,172,810 and EP 733,919A2, all incorporated by reference herein.

The interference reflector described herein can be formed from flexible, plastic, or deformable materials and can itself be flexible, plastic or deformable. These interference reflectors can be deflectable or curved to a radius usable with conventional LEDs, i.e., from 0.5 to 5 mm. These flexible interference reflectors can be deflected or curved and still retain its pre-deflection optical properties.

Known self-assembled periodic structures, such as cholesteric reflecting polarizers and certain block copolymers, are considered to be multilayer interference reflectors for purposes of this application. Cholesteric mirrors can be made using a combination of left and right handed chiral pitch elements.

In an illustrative embodiment, a long-pass filter that partially transmits all wavelengths of blue light can be used in combination with a thin yellow phosphor layer in order to direct some blue light from the LED back onto the phosphor layer after the first pass through the phosphor.

In addition to providing reflection of UV light, a function of the multilayer optical film can be to block transmission of UV light so as to prevent degradation of subsequent elements inside or outside the LED package, including prevention of human eye damage. In some embodiments, it may be advantageous to incorporate a UV absorber on the side of the UV reflector furthest away from the LED. This UV absorber can be in, on, or adjacent to the multilayer optical film.

Although a variety of methods are known in the art for producing interference filters, an all polymer construction can offer several manufacturing and cost benefits. If high temperature polymers with high optical transmission and large index differentials are utilized in the of an interference filter, then an environmentally stable filter that is both thin and very flexible can be manufactured to meet the optical needs of short-pass (SP) and (LP) filters. In particular, coextruded multilayer interference filters as taught in U.S. Pat. No. 6,531,230 (Weber et al.) can provide precise wavelength selection as well as large area, cost effective manufacturing. The use of polymer pairs having high index differentials allows the construction of very thin, highly reflective mirrors that are freestanding, i.e. have no substrate but are still easily processed. Such interference structures will not crack or shatter or otherwise degrade either when thermoformed or when flexed to a radius of curvature as small as 1 mm.

An all polymeric filter can be thermoformed into various 3D shapes such as e.g. hemispherical domes (as described below). However, care must be taken to control the thinning to the correct amount over the entire surface of the dome to create the desired angular performance. Filters having a simple two dimensional curvature are easier to create than 3D, compound shaped filters. In particular, any thin and flexible filter can be bent into a 2D shaped such as e.g. a part of a cylinder, in this case an all polymeric filter is not needed. Multilayer inorganic filters on thin polymeric substrates can be shaped in this manner, as well as can inorganic multilayers on glass substrates that are less than 200 microns in thickness. The latter may have to be heated to temperatures near the glass transition point to obtain a permanent shape with low stress.

Optimum bandedges for long and short pass filters will depend on the emission spectra of both the LED and the phosphor in the system the filters are designed to operate in. In an illustrative embodiment, for a short pass filter, substantially all of the LED emission passes through the filter to excite the phosphor, and substantially all of the phosphor emissions are reflected by the filter so they do not enter the LED or its base structure where they could be absorbed. For this reason, the short pass defining bandedge is placed in a region between the average emission wavelength of the LED and the average emission wavelength of the phosphor. In an illustrative embodiment, the filter is placed between the LED and the phosphor. If however, the filter is planar, the emissions from a typical LED will strike the filter at a variety of angles, and at some angle of incidence be reflected by the filter and fail to reach the phosphor. Unless the filter is curved to maintain a nearly constant angle of incidence, one may desire to place the design bandedge at a wavelength larger than the midpoint of the phosphor and LED emission curves to optimize the overall system performance. In particular, very little of the phosphor emission is directed to the filter near zero degrees angle of incidence because the included solid angle is very small.

In another illustrative embodiment, long pass reflective filters are placed opposite the phosphor layer from the LED in order to recycle the LED excitation light back to the phosphor in order to improve system efficiency. In the illustrative embodiment, a long pass filter may be omitted if the LED emissions are in the visible spectrum and large amounts are needed to balance the phosphor color output. However, a long pass filter that partially transmits the shortwave light, such as e.g. blue light, can be used to optimize the angular performance of a blue-LED/yellow-phosphor system via the spectral angle shift that would pass more blue light at higher angles than at normal incidence.

In a further illustrative embodiment, the LP filter is curved, in order to maintain a nearly constant angle of incidence of the LED emitted light on the filter. In this embodiment, the phosphor and the LED both face one side of the LP filter. At high angles of incidence, the LP filter will not reflect the shortwave light. For this reason, the long wave bandedge of the LP filter can be placed at as long a wavelength as possible while blocking as little of the phosphor emission as possible. Again, the bandedge placement can be changed to optimize the overall system efficiency.

The term "adjacent" is defined herein to denote a relative positioning of two articles that are near one another. Adjacent items can be touching, or spaced away from each other with one or more materials disposed between the adjacent items.

LED excitation light can be any light that an LED source can emit. LED excitation light can be UV, or blue light. Blue light also includes violet and indigo light. LEDs include spontaneous emission devices as well as devices using stimulated or super radiant emission including laser diodes and vertical cavity surface emitting laser diodes.

Layers of phosphor described herein can be a continuous or discontinuous layer. The layers of phosphor material can be a uniform or non-uniform pattern. The layer of phosphor material can be plurality of regions having a small area such as, for example, a plurality of "dots" each having an area in plan view of less than 10000 micrometers$^2$ or from 500 to 10000 micrometers$^2$. In an illustrative embodiment, the plurality of dots can each be formed from a phosphor which emits visible light at one or more different wavelengths such as, for example, a dot emitting red, a dot emitting blue, and a dot emitting green. The dots emitting visible light at a plurality of wavelengths can be arranged and configured in any uniform or non-uniform manner as desired. For example, the layer of phosphor material can be a plurality of dots with a non-uniform density gradient along a surface or an area. The "dots" can have any regular or irregular shape, and need not be round in plan view. Phosphor material can be in a co-extruded skin layer of the multilayer optical film.

Structured phosphor layers can be configured in several ways to provide benefits in performance, as described below. When multiple phosphor types are used to provide broader or fuller spectral output, light from shorter wavelength phosphors can be re-absorbed by other phosphors. Patterns comprising isolated dots, lines, or isolated regions of each phosphor type reduce the amount of re-absorption. This would be particularly effective in cavity type constructions where unabsorbed pump light is reflected back to the phosphor pattern.

Multilayer structures can also reduce absorption. For example, it could be advantageous to form layers of each phosphor in sequence, with the longest wavelength emitter nearest the excitation source. Light emitted nearer the emitter will on average, undergo multiple scattering within the total phosphor layer to a greater extent than light emitted near the output surface. Since the shortest wavelength emitted is most prone to re-absorption, it is advantageous to locate the shortest wavelength phosphor nearest to the output surface. In addition, it may be advantageous to use different thicknesses for each layer, so as to compensate for the progressively lower intensity of the excitation light as it propagates through the multilayer structure. For phosphor layers with similar absorption and emission efficiency, progressively thinner layers from excitation to output side would provide compensation for the decreasing excitation intensity in each layer. It would also be advantageous to place short pass filters in-between the different phosphor layers so as to reduce emitted phosphor light from scattering backward and being re-absorbed by phosphor layers earlier in the sequence.

Forming film structures with phosphor coating also enables manufacturing of arrays of small structures suitable for dicing into individual units for diodes. For example, an array of small domes or hemispheres could be printed, each of which would be useful for reducing the "halo effect" sometimes present for PLED's (as described below).

Non-scattering phosphor layers can provide enhanced light output in combination with multilayer optical films. Non-scattering phosphor layers can comprise conventional phosphors in an index-matched binder (for example, a binder with high index inert nanoparticles), nanosize particles of conventional phosphor compositions (for examples, where particle sizes are small and negligibly scatter light), or through the use of quantum dot phosphors. Quantum dot phosphors are light emitters based on semiconductors such as cadmium sulfide, wherein the particles are sufficiently small so that the electronic structure is influenced and controlled by the particle size. Hence, the absorption and emission spectra are controlled via the particle size. Quantum dots are disclosed in U.S. Pat. No. 6,501,091, incorporated by reference herein.

Embodiments are disclosed herein where a first optical component comprising a phosphor/reflector assembly can be later attached to an LED base; a heat sink can optionally include a transparent heat sink to which the phosphor layer and interference filter may be attached. The transparent heat sink can be a layer of sapphire disposed between the phosphor layer/interference filter and the LED base. Most glasses have a higher thermal conductivity than polymers and can be useful in this function as well. Many other crystalline material's thermal conductivities are higher than most glasses and can be used here also. The sapphire layer can be contacted at the edges by a metal heat sink.

In an illustrative embodiment, prior to coating the interference filter (i.e., polymeric interference filter with a phosphor layer, the surface of the filter can be treated to promote adhesion of the coating. The optimum treatment depends both on the surface layer of the filter and on the materials in the phosphor coating, specifically the binder used to hold the phosphor particles on the surface. The surface treatment can be a standard corona discharge treatment, or a corona discharge followed by a priming layer. The priming layer is typically less than 1 micron thick. Useful priming materials are PVDC, sulphonated polyesters and other amorphous polyesters such as Vitel, maleated copolymers such as Bynel (Dupont) and Admer (Mitsui Chemicals), and EVA such as Elvax (Dupont). Binders for the phosphor layer can be a thermoplastic and/or thermoformable and can be a fluoropolymer, or silicon based material, for example.

Alternative priming layers include, for example, vacuum coated layers, preferably from energetic sources such as ion-beam or gas plasma sources wherein the ions or plasma components bombard the polymer surface while depositing the priming layer. Such priming layers are typically inorganic material layers such as titania or silica layers.

Although much attention has been given to the use of phosphors for down-converting short wavelength light to visible light, it is also possible to up-convert infrared radiation to visible light. Up-converting phosphors are well known in the art and typically use two or more infrared photons to generate 1 visible photon. Infrared LEDs needed to pump such phosphors have also been demonstrated and are very efficient. Visible light sources that use this process can be made more efficient with the addition of long-pass (LP) and short-pass (SP) filters although the functions of each are reversed in this case compared to the down-converting phosphor systems. A SP filter can be used to direct IR light towards the phosphor while transmitting the visible light, and an LP filter can be placed between the phosphor and LED to direct the emitted visible light outward towards the intended system or user.

The lifetime of an SP or LP filter is preferably greater than or equal to the lifetime of the LED in the same system. The degradation of a polymeric interference filter can be due to overheating which can cause material creep which changes the layer thickness values and therefore the wavelengths that the filter reflects. In the worst case, overheating can cause the polymer materials to melt, resulting in rapid flow of material and change in wavelength selection as well as inducing non-uniformities in the filter.

Degradation of polymer materials can also be induced by short wavelength (actinic) radiation such as blue, violet or UV radiation, depending on the polymer material. The rate of degradation is dependent both on the actinic light flux and on the temperature of the polymer. Both the temperature and the flux will in general, decrease with increasing distance from the LED. Thus it is advantageous in cases of high brightness LEDs, particularly UV LEDs, to place a polymeric filter as far from the LED as the design can allow. Placement of the polymer filter on a transparent heat sink as descibed above can also improve the lifetime of the filter. For domed filters, the flux of actinic radiation decreases as the square of the distance from the LED. For example, a hemispherical MOF reflector with a 1 cm radius, placed with a unidirectional 1 watt LED at the center of curvature, would experience an average intensity of $1/(2\pi)$ Watts/cm$^2$ (surface area of the dome=$2\pi$ cm$^2$). At a 0.5 cm radius, the average intensity on the dome would be four times of that value, or $2/\pi$ W/cm$^2$. The system of LED, phosphor, and multilayer optical film can be designed with light flux and temperature control taken into consideration.

A reflective polarizer can be disposed adjacent the multilayer reflector and/or adjacent the phosphor material. The reflective polarizer allows light of a preferred polarization to be emitted, while reflecting the other polarization. The phosphor layer and other film components known in the art can depolarize the polarized light reflected by reflective polarizer, and either by the reflection of the phosphor layer, or phosphor layer in combination with the multilayer reflector, light can be recycled and increase the polarized light brightness of the solid state light device (LED). Suitable reflective polarizers include, for example, cholesteric reflective polarizers, cholesteric reflective polarizers with a ¼ wave retarder, DBEF reflective polarizer available from 3M Company or DRPF reflective polarizer also available from 3M Company. The reflective polarizer preferably polarizes light over a substantial range of wavelengths and angles emitted by the phosphor, and in the case where the LED emits blue light, may reflect the LED emission wavelength range as well.

Suitable multilayer reflector films are birefringent multilayer optical films in which the refractive indices in the thickness direction of two adjacent layers are substantially matched and have a Brewster angle (the angle at which reflectance of p-polarized light goes to zero) which is very large or is nonexistant. This allows for the construction of multilayer mirrors and polarizers whose reflectivity for p-polarized light decreases slowly with angle of incidence, are independent of angle of incidence, or increase with angle of incidence away from the normal. As a result, multilayer films having high reflectivity (for both planes of polarization for any incident direction in the case of mirrors, and for the selected direction in the case of polarizers) over a wide bandwidth, can be achieved. These polymeric multilayer reflectors include alternating layers of a first and second thermoplastic polymer. The alternating layers defining a local coordinate system with mutually orthogonal x- and y-axes extending parallel to the layers and with a z-axis orthogonal to the x- and y-axes, and wherein at least some of the layers are birefringent. The absolute value of the difference in indices of refraction between the first and second layers is $\Delta x$, $\Delta y$, and $\Delta z$ respectively, for light polarized along first, second, and third mutually orthogonal axes. The third axis is orthogonal to the plane of the film where $\Delta x$ is greater than about 0.05, and where $\Delta z$ is less than about 0.05. These films are described, for example, in U.S. Pat. No. 5,882,774, which is incorporated by reference herein.

Non-planar is defined as surface that is not flat. A non-planar surface can be formed, for example, by deflecting a flat article forming a curved article. The non-planar multilayer reflectors can be cast directly into a non-planar shaped article or thermoformed from a planar multilayer reflector into a non-planar multilayer reflector. The non-planar multilayer reflectors can be a concave shape. In an illustrative embodiment, the non-planar multilayer reflector can be a hemispherical concave shape. The LED can be located at or near the center of curvature of the non-planar multilayer reflector. In an illustrative embodiment, the non-planar multilayer reflector is a hemispherical concave shape opening towards the LED. The lateral extent of the light emitting region of the LED can be less than ⅓, or less than ⅙ of the minimum radius of curvature of the non-planar multilayer reflector.

Figure 13:
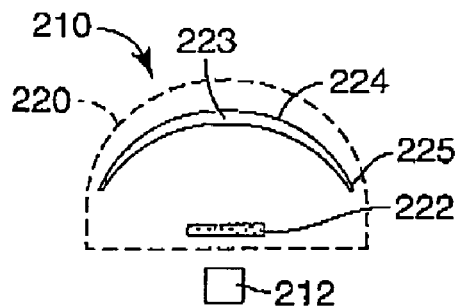
FIGS. 13-17 are schematic sectional views of other embodiments of PLED constructions.

FIG. 13 is a schematic sectional view of another embodiment of a PLED construction 210. A non-planar multilayer reflector 224 is shown adjacent a layer of phosphor material 222, however the non-planar multilayer reflector 224 need only be positioned such that light can travel between the layer of phosphor material 222 and the multilayer reflector 224. The non-planar multilayer reflector 224 reflects LED excitation light excitation light such as, for example UV, or blue light and transmits visible light. This non-planar multilayer reflector 224 can be referred to as a long-pass (LP) reflector, as described above. The above arrangement can be disposed within an optically transparent material 220.

The non-planar multilayer reflector 224 can be positioned to receive light from an LED 212, as discussed herein. The non-planar multilayer reflector 224 can be any useable thickness. The non-planar polymeric multilayer reflector 224 can be 5 to 200 micrometers thick or 10 to 100 micrometers thick. The non-planar multilayer reflector 224 can optionally be substantially free of inorganic materials.

The non-planar multilayer reflector 224 can be formed of a material that resists degradation when exposed to V, blue or violet light such, as discussed herein. The multilayer reflectors discussed herein can be stable under high intensity illumination for extended periods of time. High intensity illumination can be generally defined as a flux level from 1 to 100 Watt/cm$^2$. Operating temperatures at the interference reflectors can be 100° C. or less, or 65° C. or less. Suitable illustrative polymeric materials can include UV resistant material formed from, for example, acrylic material, PET material, PMMA material, polystyrene material, polycarbonate material, THV material available from 3M (St. Paul, Minn.), and combinations thereof. These materials and PEN material can be used for blue excitation light.

The non-planar multilayer reflector 224 can have a non-uniform thickness or thickness gradient along its length, width, or both. The non-planar multilayer reflector 224 can have a first thickness at an inner region 223 of the non-planar multilayer reflector 224 and a second thickness at an outer region 225 of the non-planar multilayer reflector 224. The difference in thickness across the surface of the reflector is associated with a corresponding difference or shift in spectral reflectance, with the thinner areas being blue-shifted relative to the thicker areas. There are a variety of ways that thickness gradients can be created. For example, thickness gradients can be formed by thermoforming, embossing, laser embossing, or extrusion, to list a few.

As shown in FIG. 13, the inner region 223 thickness can be greater than the outer region 225 thickness. Increasing the inner region 223 thickness can reduce an undesirable effect know as the "halo effect". The "halo effect" is a problem known in industry where the balance of blue excitation light and yellow converted light changes as a function of viewing angle of the LED. Here, the inner region 223 thickness can be greater than the outer region 225 thickness so as to reduce on-axis blue transmission.

Figure 14:
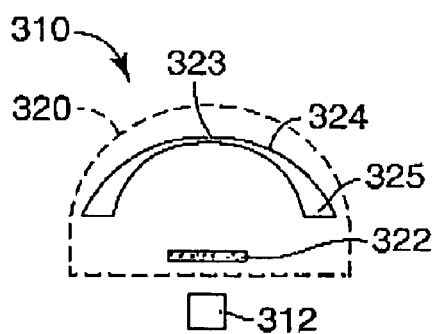

As shown in the PLED construction 310 of FIG. 14, the miter region 325 thickness can be greater than the inner region 323 thickness. The above arrangement can be disposed within an optically transparent material 320.

The non-planar multilayer reflector can be positioned in any usable configuration with the LED, as described herein. In an illustrative embodiment, the non-planar multilayer reflector is positioned between the layer of phosphor and the LED (see e.g., FIGS. 15-17). In another illustrative embodiment, the layer of phosphor is positioned between the non-planar multilayer reflector and the LED (see e.g., FIGS. 13, 14, 16-21).

The non-planar multilayer reflector 224/324 can be configured to reflect UV or blue light and transmit at least a portion of the visible light spectrum such as green, yellow, or red light. In another illustrative embodiment, the non-planar multilayer reflector 224/324 can be configured to reflect UV, blue or green light and transmit at least a portion of the visible light spectrum such as yellow or red light.

The layer of phosphor material 222/322 is capable of emitting visible light when illuminated with excitation light emitted from an LED 212/312. The layer of phosphor material can be any useable thickness. The layer of phosphor material can include any number of binders such as, for example, a polyester material. In another illustrative embodiment the layer of phosphor material can include an adhesive material. The adhesive material can be an optically functional adhesive.

Figure 15:
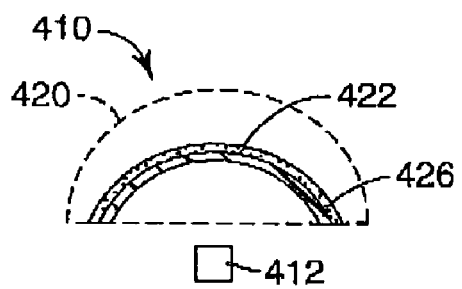

FIG. 15 is a schematic sectional view of another embodiment of a PLED construction 410. A non-planar multilayer reflector 426 is shown adjacent a layer of phosphor material 422, however the non-planar multilayer reflector 426 need only be positioned such that light can travel between the layer of phosphor material 422 and the non-planar multilayer reflector 426. The non-planar multilayer reflector 426 reflects visible light and transmits LED excitation light such as, for example UV, or blue light. This non-planar multilayer reflector 426 can be referred to as a short-pass (SP) reflector, as described above. The above arrangement can be disposed within an optically transparent material 420.

The non-planar multilayer reflector 426 may include the same materials and be formed in a similar manner as the non-planar multilayer reflector 424 described above. The phosphor layer 422 is also described above.

The non-planar multilayer reflector 426 can be positioned in any usable configuration with the LED 412 as described herein. In an illustrative embodiment shown as FIG. 15, the non-planar multilayer reflector 426 is positioned between the layer of phosphor 422 and the LED 412. In another illustrative embodiment, the layer of phosphor 422 is positioned between the non-planar multilayer reflector 426 and the LED 412. In an illustrative embodiment, non-planar multilayer reflector 426 is a hemispherical concave shape facing toward the LED 412. Such a design allows light emitted by the LED 412 to strike the non-planar multilayer reflector 426 at a normal or a near normal incidence angle. The non-planar geometry of the multilayer reflector 426 allows substantially all short wave light to pass through the non-planar multilayer reflector 426 no matter what side or direction it emanates from the LED 412.

Figure 16:
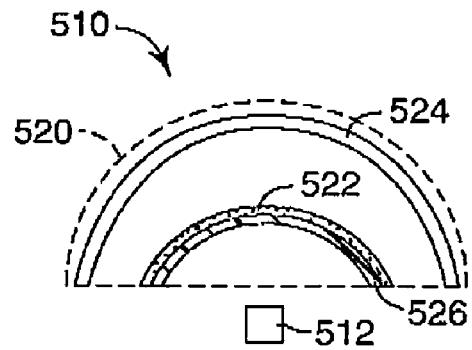

FIG. 16 is a schernalic sectional view of another embodiment of a PLED construction 510. A first non-planar multilayer reflector 524 is shown spaced away from a layer of phosphor material 522, however the first non-planar multilayer reflector 524 need only be positioned such that ligbt can travel between the layer of phosphor material 522 and the first non-planar multilayer reflector 524. The first non-planar multilayer reflector 524 reflects LED 512 such as, for example UV, or blue light and transmits visible light. This first non-planar multilayer reflector 524 can be referred to as a long-pass (LP) reflector, as described above. The above arrangement can be disposed within an optically transparent material 520.

A second non-planar multilayer reflector 526 is shown adjacent a layer of phosphor material 22, however the second non-planar multilayer reflector 526 need only be positioned such that light can travel between the layer of phosphor material 522 and the second non-planar multilayer reflector 526. The second non-planar multilayer reflector 526 reflects visible light and transmits LED excitation light such as, for example V, or blue light. This second non-planar multilayer reflector 526 can be referred to as a short-pass (SP) reflector, as described above.

A phosphor layer 522 is shown disposed between the first non-planar polymeric multilayer reflector 524 and the second non-planar polymeric multilayer reflector 526. The phosphor layer 522 is described above.

Figure 17:
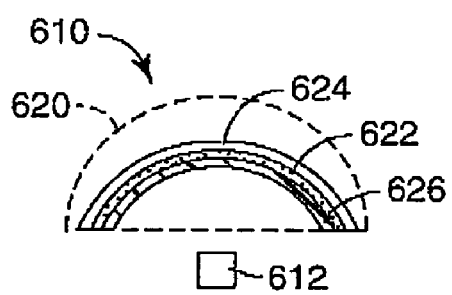

FIG. 17 is a schematic sectional view of another embodiment of a PLED construction 610. A first non-planar multilayer reflector 624 is shown adjacent a layer of phosphor material 622, however the first non-planar multilayer reflector 624 need only be positioned such that light can travel between the layer of phosphor material 622 and the first non-planar multilayer reflector 624. The first non-planar multilayer reflector 624 reflects LED 612 excitation light such as, for example UV, or blue light and transmits visible light. This first non-planar multilayer reflector 624 can be referred to as a long-pass (LP) reflector, as described above. The above arrangement can be disposed within an optically transparent material 620.

A second non-planar multilayer reflector 626 is shown adjacent a layer of phosphor material 622, however the second non-planar multilayer reflector 626 need only be positioned such that light can travel between the layer of phosphor material 622 and the second non-planar multilayer reflector 626. The second non-planar multilayer reflector 626 reflects visible light and transmits LED excitation light such as, for example UV, or blue light. This second non-planar multilayer reflector 626 can be referred to as a short-pass (SP) reflector, as described above.

A phosphor layer 622 is shown disposed between the first non-planar multilayer reflector 624 and the second non-planar multilayer reflector 626. The phosphor layer 622 is described above.

Figure 18:
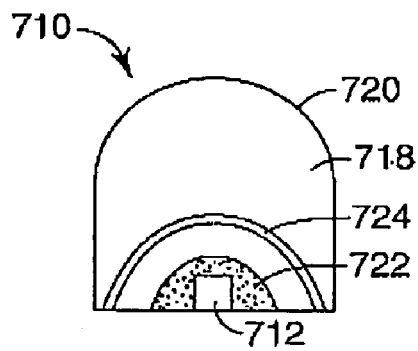
FIGS. 18-21 are sectional views of other embodiments of PLED constructions.
Figure 19:
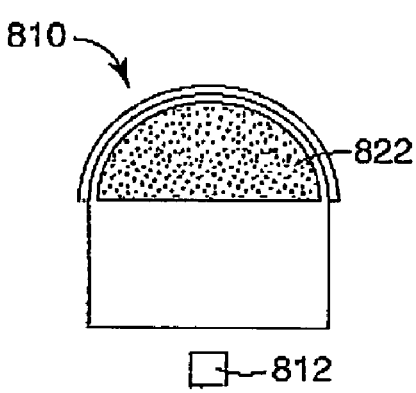
Figure 20:
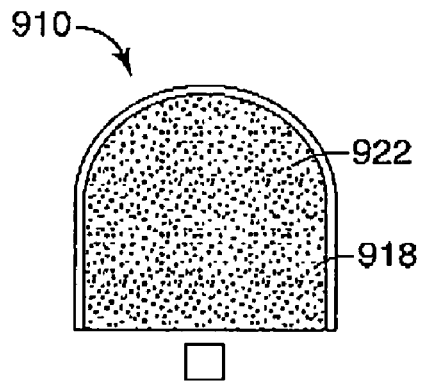
Figure 21:
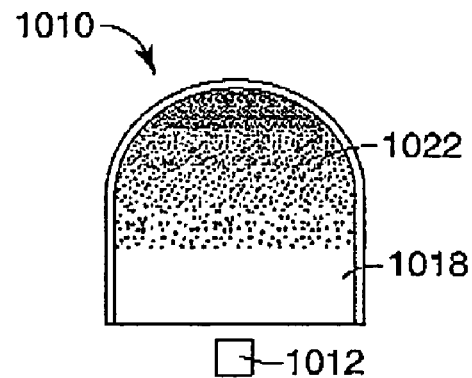

FIG. 18 is a sectional view of another embodiment of a PLED construction 710. A non-planar multilayer reflector 724 is shown spaced away from a layer of phosphor material 722, however the non-planar multilayer reflector 724 need only be positioned such that light can travel between the layer of phosphor material 722 and the non-planar multilayer reflector 724. The non-planar multilayer reflector 724 reflects LED excitation light excitation light such as, for example UV, or blue light and transmits visible light. This non-planar multilayer reflector 724 can be referred to as a long-pass (LP) reflector, as described above.

A phosphor layer 722 is shown disposed between the LED 712 and the non-planar polymeric multilayer reflector 724. The phosphor layer 722 is also described above. The phosphor layer 722 is shown in FIG. 18 as a dome of phosphor material encompassing the LED 712.

The non-planar multilayer reflector 724 and phosphor layer 722 is shown disposed within an optically transparent body 718. The non-planar multilayer reflector 724 can be located at any position within or on a surface 720 of the optically transparent body 718.

The phosphor layer 722 can be located at any position within or on a surface 720 of the optically transparent body 718. For example, the phosphor layer 722 can be disposed adjacent the LED 712 as shown in FIG. 18. In another illustrative embodiment, the phosphor layer 822 can be spaced apart from the LED 812 as shown in PLED construction 810 of FIG. 19. In another illustrative embodiment, the phosphor layer 922 can be disposed within or on the entire optically transparent body 918 as shown in PLED construction 910 of FIG. 20. In another illustrative embodiment, the phosphor layer 1022 can be disposed on or in the optically tansparent body 1018 such that the phosphor layer 1022 has a greater thickness or density at normal angles of incident from the LED 1012 and decreasing in thickness or density as the angles of incident from the LED 1012 become greater. Thus, the phosphor layer 1022 can have a volume density gradient, and/or a surface area density gradient as a function of LED 1012 incident angle as shown in PLED construction 1010 of FIG. 21.

EXAMPLES

Measurement of phosphor luminescence herein was made using a spectroradiometer (designated OL 770-LED by Optronic Laboratories, Inc., Orlando, Fla., USA) fitted with an integrating sphere (designated OL IS-670-LED by Optronic Laboratories) and a high precision LED holder (designated OL 700-80-20 by Optronic Laboratories). The spectroradiometer is calibrated to report the total radiant energy entering the integrating sphere at the input port (in units of Watts per nanometer). A 1 inch diameter disk was made from the phosphor coated sample using a custom punch. This disk fits into a custom film adaptor made to mount on the high precision LED holder. The custom adaptor holds the film sample approximately one inch above the base of the packaged LED. Measurements were performed by mounting an LED into the holder, placing the film with the phosphor coating into the adaptor, affixing the adaptor to the light-emitting diode mount and then inserting the diode mount assembly into the entrance aperture of the integrating sphere. If necessary, calibrated neutral density filters were used to adjust the light level reaching the detector of the spectroradiometer.

Unless otherwise stated, the multilayer optical films used in the following examples reflected both polarization states equally at normal incidence (i.e., each of the individual optical layers had nominally equal refractive indices along orthogonal in-plane axes).

For all of the following examples in which the thickness of the phosphor layer is given, the thickness was determined by subtracting the thickness of the substrate film from the thickness of the phosphor layer and substrate film together. The thicknesses were measured using a dial indicator (catalog number 52-520-140 by Fred V. Fowler Co., Inc., of Newton, Mass., USA) with a flat contact point (catalog number 52-525-035, also from Fowler) mounted on a dial gage stand (catalog number 52-580-020, also from Fowler). The thickness of the substrate film was the average of three measurements at random locations on the substrate film. The thickness of the phosphor layer and substrate film was the average of six measurements taken at random locations on the phosphor layer.

Example 1

A coating of cerium-doped yttrium aluminum garnet (YAG:Ce) phosphor was made on single layer clear poly (ethylene terephthalate) (PET) film by the following procedure.

12.00 grams of fluorpolymer resin (designated "Phosphor Ink Part A: Resin Solution", part number: 1INR001, rev: AA, batch number: KY4-035 by Durel Company of Chandler, Ariz., USA) was placed into a 40 milliliter glass jar. 15.02 grams of YAG:Ce phosphor (designated QMK58/F-U1 Lot #13235 by Phosphor Technology, Ltd. of Stevenage, England) was measured into a weighing dish. The phosphor was mixed into the resin by first adding one-half of the phosphor to the resin and mixing it in by hand with a stainless steel spatula and then adding the other half and mixing it by hand. The phosphor and resin were mixed by hand until the mixture had a smooth texture and uniform appearance. The jar containing the resulting phosphor paste was covered with a lid and placed on a bottle roller for about 30 minutes.

A sheet of single layer clear PET film 3M Company (St. Paul, Minn.) 6 inches wide by 10 inches long by 1.5 mils thick was placed on a clean flat surface. Both surfaces of the PET film were wiped with a lint-free cotton cloth dampened with methanol. The jar containing the phosphor paste was removed from the bottle roller and about 5 grams of paste was placed into a small puddle on the PET film. The phosphor paste was hand-drawn into a coating using the 5 mil gap of a square multiple clearance applicator (designated PAR-5357 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA). After curing, the phosphor/resin coating thickness was 1.6 mils.

Figure 22:
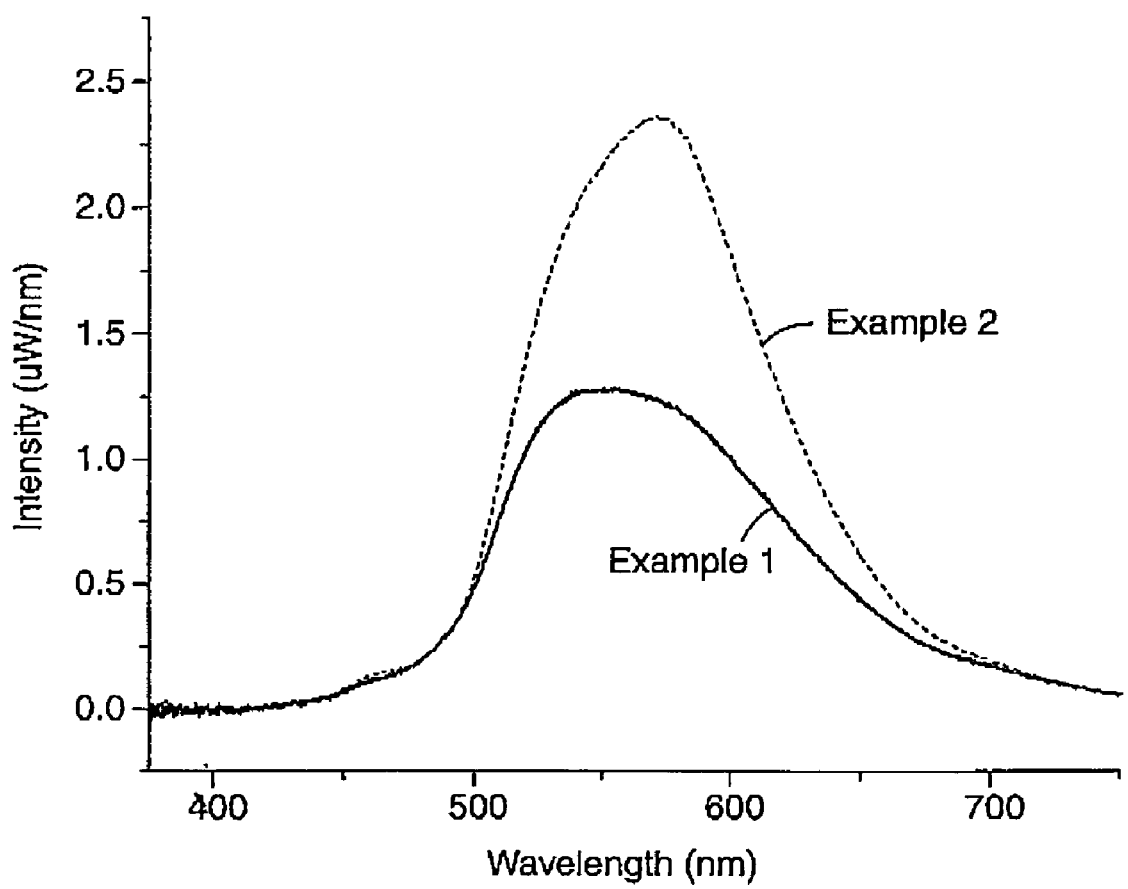
FIG. 22 is a graph of a light intensity spectrum of Examples 1 and 2.

A 1 inch diameter disk of the YAG:Ce coated film was prepared and mounted into the spectroradiometer as described above. The disk was oriented with the phosphor coated side facing into the integrating sphere. A blue LED (designated Part #25-365 by Hosfelt Electronics, Inc., Steubenville, Ohio) with a peak wavelength of about 463 nm was used to excite the phosphor. The standard 5 mm package for the blue LED was modified by machining off the domed lens at the top of the package to provide a flat exit face for the blue light. Approximately 0.18 inch of the package was removed from the top of the package. The LED was powered at 20 milliamps and 3.46 volts by a constant current power supply. The emission spectra of the phosphor layer recorded using the spectroradiometer is shown in FIG. 22 as the curve labeled "Example 1". Using software supplied with the spectroradiometer, the total luminous flux emitted into the integrating sphere was calculated to be 0.068 lumens.

Example 2

A piece of multi-layer optical film (MOF) having alternating layers of PET and co-PMMA and having a normal-incidence reflection band (measured at half-maximum) from about 600 nm to about 1070 nm (made in accordance with U.S. Pat. No. 6,531,230) was placed in the film adaptor between the phosphor coated PET film of Example 1 and the blue LED of Example 1 (operated at 20 milliamps). The spectrum was recorded and is shown in FIG. 22 as the curve labeled "Example 2". Using software supplied with the spectroradiometer, the total luminous flux emitted into the integrating sphere was calculated to be 0.118 lumens. This represents an increase in luminous intensity of 73%.

Example 3

A coating of zinc sulfide (ZnS) phosphor was made on poly (ethylene terepthalate) (PET) film by the following procedure:

20.04 grams of fluoropolymer resin (designated "Phosphor Ink Part A: Resin Solution", part number: 1INR001, rev: AA, batch number: KY4-035 by Durel Company of Chandler, Ariz., USA) was placed into a 2 ounce glass jar. 20.06 grams of ZnS phosphor (designated GL29A/N-C1 Lot #11382 by Phosphor Technology, Ltd. of Stevenage, England) was measured into a weighing dish. The phosphor was mixed into the resin by first adding one-half of the phosphor to the resin and mixing it in by hand with a stainless steel spatula and then adding the other half and mixing it by hand. The phosphor and resin were mixed by hand until the mixture had a smooth texture and uniform appearance. The jar containing the resulting phosphor paste was covered with a lid and placed on a bottle roller for about 24 hours.

A sheet of clear PET film by 3M Company (St. Paul, Minn.) 6 inches wide by 10 inches long by 1.5 mils thick was placed on a clear flat surface. Both surfaces of the PET film were wiped with a lint-free cotton cloth dampened with methanol. The jar containing the phosphor paste was removed from the bottle roller and about 3 grams of paste was placed onto the PET film. The phosphor paste was hand-drawn into a coating using the 2 mil gap of a square multiple clearance applicator (designated PAR-5353 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA). After curing the phosphor/resin coating thickness was 0.7 mils.

Figure 23:
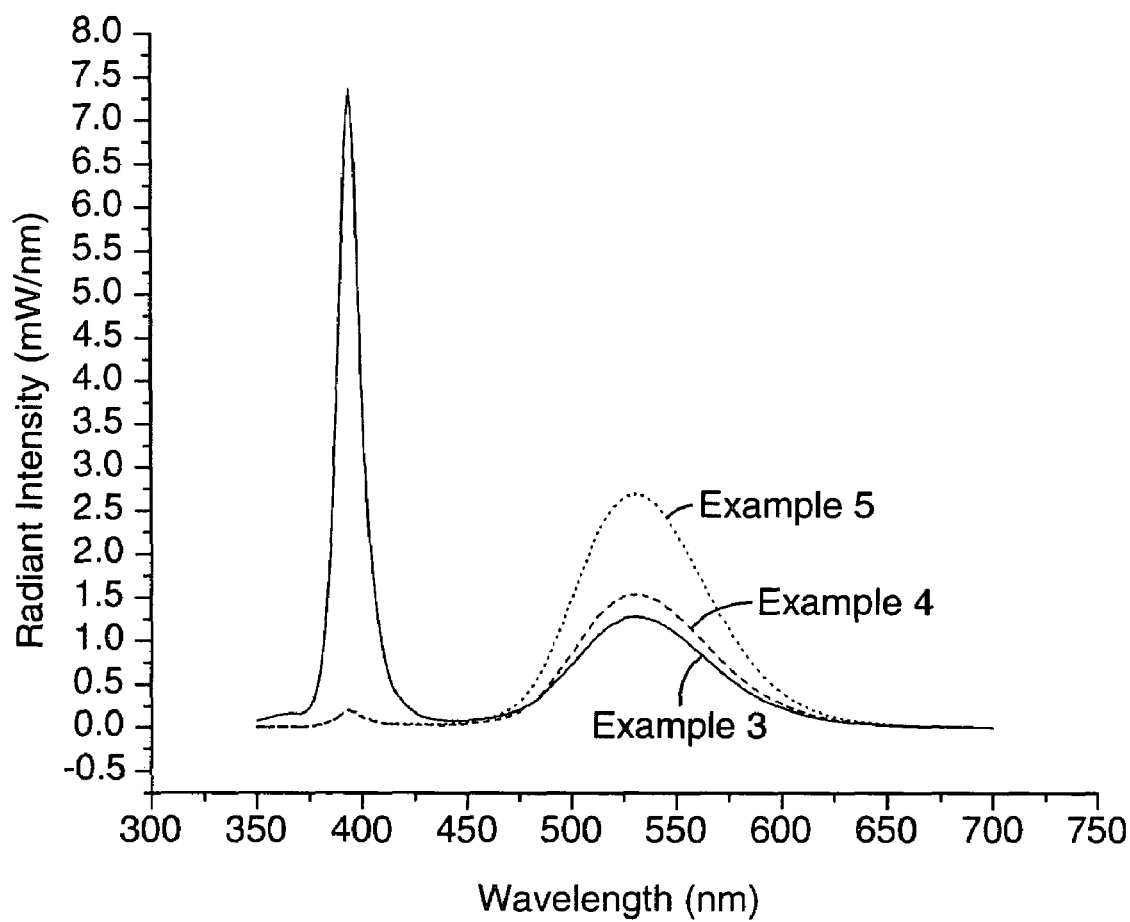
FIG. 23 is a graph of a light intensity spectrum of Examples 3, 4, and 5.

A one inch diameter disk of the ZnS coated film was prepared and mounted into the spectroradiometer as described above. The disk was oriented with the phosphor coated side facing into the integrating sphere. A UV LED (designated Part #25-495 by Hosfelt Electronics, Inc of Steubenville, Ohio) with a peak wavelength of about 395 nm was used to excite the phosphor fluorescence. The standard 5 mm package for the UV LED was modified by machining off the domed top of the package to provide a flat exit face for the UV light. Approximately 0.180 inches of the package was removed from the top of the package. The LED was powered at 20 milliamps and 3.7 volts by a constant current power supply. The emission spectra of the phosphor layer recorded using the spectroradiometer is shown in FIG. 23 as the curve labeled "Example 3". Using software supplied with the spectroradiometer, the total luminous flux emitted into the integrating sphere was calculated to be 0.052 lumens.

Example 4

A piece of multi-layer optical film (MOF) having alternating layers of PET and co-PMMA and having a normal-incidence reflection band (measured at half-maximum) from about 320 nm to about 490 nm (made in accordance with U.S. Pat. No. 6,531,230) was placed in the film adaptor on top of the phosphor layer of Example 3, and the UV LED of Example 3 (operated at 20 milliamps) was used as the excitation source. The spectrum was recorded and is shown in FIG. 23 as the curve labeled "Example 4". Using software supplied with the spectroradiometer, the total luminous flux emitted into the integrating sphere was calculated to be 0.062 lumens. This represents an increase in luminous intensity when compared to Example 3 of about 19%.

Example 5

A broadband visible reflector was made by laminating two pieces of multi-layer optical film (MOF). A layer of MOF having alternating layers of PET and co-PMMA and a normal-incidence reflection band (measured at half-maximum) from about 490 nm to about 610 nm (manufactured by 3M Company of St. Paul, Minn.) was laminated to a layer of MOF having alternating layers of PET and co-PMMA and having a normal-incidence reflection band (measured at half-maximum) from about 590 nm to about 710 nm (manufactured by 3M Company of St. Paul, Minn.) using a optically clear adhesive. The laminate was placed in the film adaptor between the phosphor coated PET film of Example 3, and the UV LED of Example 3 (operated at 20 milliamps). A piece of multi-layer optical film (MOF) having alternating layers of PET and co-PMMA and having a normal-incidence reflection band (measured at half-maximum) from about 320 nm to about 490 nm (manufactured by 3M Company of St. Paul, Minn.) was placed in the film adaptor on top of the phosphor layer to create a cavity having a phosphor layer sandwiched between a visible mirror on the LED side and a UV/blue mirror on the other side. The spectrum was recorded and is shown in FIG. 23 as the curve labeled "Example 5". Using software supplied with the spectroradiometer, the total luminous flux emitted into the integrating sphere was calculated to be 0.106 lumens. This represents an increase in luminous intensity when compared to Example 3 of about 104%.

Example 6

A coating of zinc sulfide (ZnS) phosphor was made on poly (ethylene terepthalate) (PET) film by the following procedure:

The phosphor paste described in Example 3 was coated onto a sheet of clear PET film 6 inches wide by 10 inches long by 1.5 mils thick. The PET was placed on top of a clean flat surface. Both surfaces of the PET film were wiped with a lint-free cotton cloth dampened with methanol. About 3 grams of paste was placed onto the PET film. The phosphor paste was hand-drawn into a coating using the 4 mil gap of a square multiple clearance applicator (designated PAR-5353 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA). After curing, the phosphor/resin coating thickness was 1.3 mils.

Figure 24:
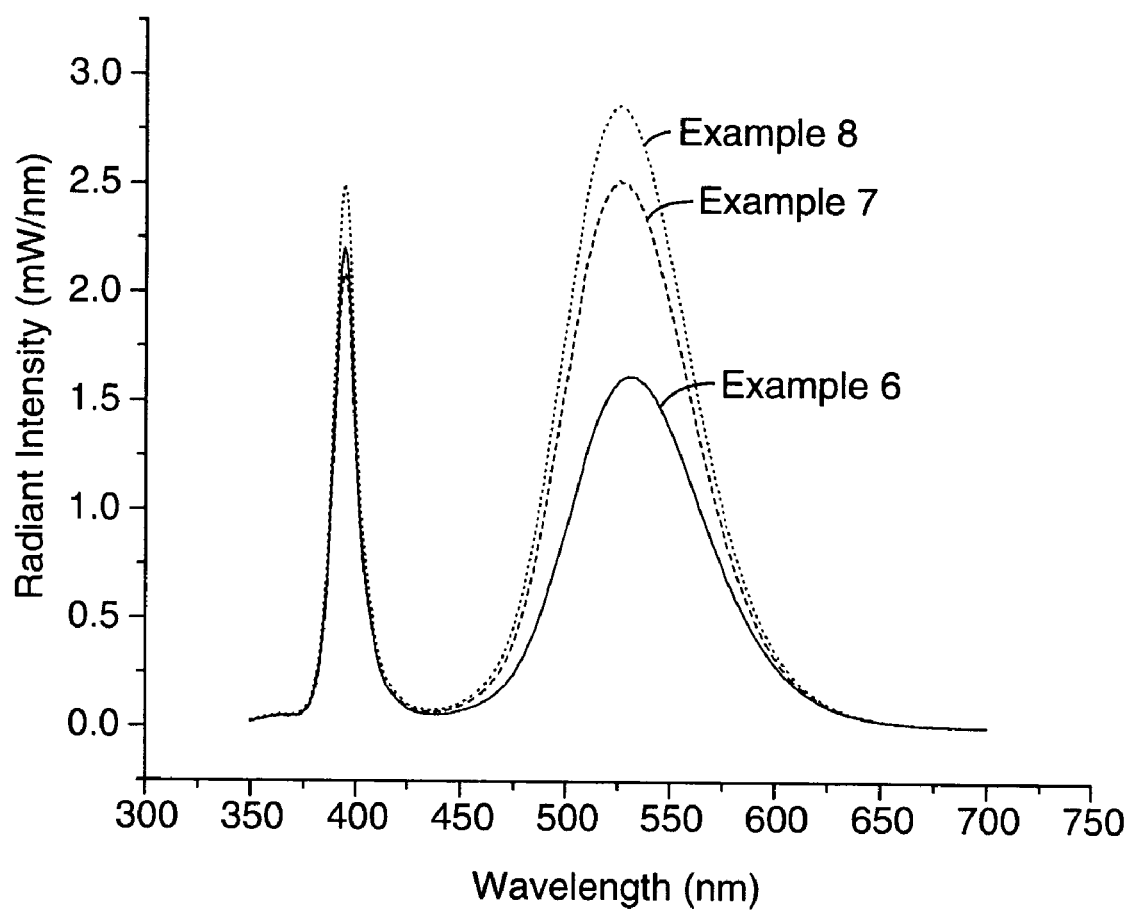
FIG. 24 is a graph of a light intensity spectrum of Examples 6, 7, and 8.

A one inch diameter disk of the ZnS coated film was prepared and mounted into the spectroradiometer as described above. The disk was oriented with the phosphor coated side facing into the integrating sphere. A UV LED (designated Part #25-495 by Hosfelt Electronics, Inc of Steubenville, Ohio) with a peak wavelength of about 395 nm was used to excite the phosphor. The standard 5 mm package for the UV LED was modified by machining off the domed top of the package to provide a flat exit face for the UV light. Approximately 0.180 inches of the package was removed from the top of the package. The LED was powered at 20 milliamps and 3.7 volts by a constant current power supply. The emission spectra of the phosphor layer recorded using the spectroradiometer is shown in FIG. 24 as the curve labeled "Example 6". Using software supplied with the spectroradiometer, the total luminous flux emitted into the integrating sphere was calculated to be 0.066 lumens.

Example 7

A piece of multi-layer optical film (MOF) having alternating layers of PET and co-PMMA and having a normal-incidence reflection band (measured at half-maximum) from about 490 nm to about 610 nm (manufactured by 3M Company of St. Paul, Minn.) was placed in the film adaptor between the phosphor coated PET film of Example 6 and the UV LED of Example 6 (operated at 20 milliamps). The spectrum was recorded and is shown in FIG. 24 as the curve labeled "Example 7". Using software supplied with the spectroradiometer, the total luminous flux emitted into the integrating sphere was calculated to be 0.095 lumens. This represents an increase in luminous intensity when compared to Example 6 of about 44%.

Example 8

A coating of zinc sulfide (ZnS) phosphor was made on multi-layer optical film (MOF) by the following procedure:

The phosphor paste described in Example 3 was coated onto a sheet of MOF having alternating layers of PET and co-PMMA and having a normal-incidence reflection band (measured at half-maximum) from about 490 nm to about 610 nm (manufactured by 3M Company of St. Paul, Minn.). The MOF was placed on top of a clean flat surface. Both surfaces of the MOF film were wiped with a lint-free cotton cloth dampened with methanol. About 3 grams of paste was placed onto the MOF film. The phosphor paste was hand-drawn into a coating using the 4 mil gap of a square multiple clearance applicator (designated PAR-5353 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA). After curing, the phosphor/resin coating thickness was 1.3 mils.

A one inch diameter disk of the ZnS coated film was prepared and mounted into the spectroradiometer as described above. The disk was oriented with the phosphor coated side facing into the integrating sphere. A UV LED (designated Part #25-495 by Hosfelt Electronics, Inc of Steubenville, Ohio) with a peak wavelength of about 395 nm was used to excite the phosphor. The standard 5 mm package for the UV LED was modified by machining off the domed top of the package to provide a flat exit face for the UV light. Approximately 0.180 inches of the package was removed from the top of the package. The LED was powered at 20 milliamps and 3.7 volts by a constant current power supply. The emission spectra of the phosphor layer recorded using the spectroradiometer is shown in FIG. 24 as the curve labeled "Example 8". Using software supplied with the spectroradiometer, the total luminous flux emitted into the integrating sphere was calculated to be 0.107 lumens. This represents an increase in luminous intensity when compared to Example 6 of about 62%.

Example 9

A coating of zinc sulfide (ZnS) phosphor was screen printed on the laminated multi-layer optical film (MOF) described in Example 5 by the following procedure:

150 grams of fluorpolymer resin (designated "Phosphor Ink Part A: Resin Solution", part number: 1INR001, rev: AA, batch number: KY4-035 by Durel Company of Chandler, Ariz., USA) was placed into a 16 ounce glass jar. 150 grams of ZnS phosphor (designated GL29A/N-C1 Lot #11382 by Phosphor Technology, Ltd. of Stevenage, England) was measured into a weighing dish. The phosphor was slowly mixed into the resin using a glass impeller driven by an air motor. The phosphor and resin were mixed until the mixture had a smooth texture and uniform appearance. The jar containing the resulting phosphor paste was covered with a lid and placed on a bottle roller for about 10 minutes.

The printing was done using a halftone pattern with a resolution of 28 lines per inch on a 280 thread per inch PET screen mounted on a screen printer (designated Type SSM by Svecia Silkscreen Maskiner AB, of Stockholm, Sweden). The halftone pattern consisted of three regions having 10%, 50% and 90% coverage. The pattern was printed in one pass onto a sheet of the two laminated MOF films described in Example 5.

The printed layer was cured at a temperature of about 138° C. for 15 minutes in a forced air oven. After curing, the phosphor/resin coating thickness was 0.8 mils.

Figure 25:
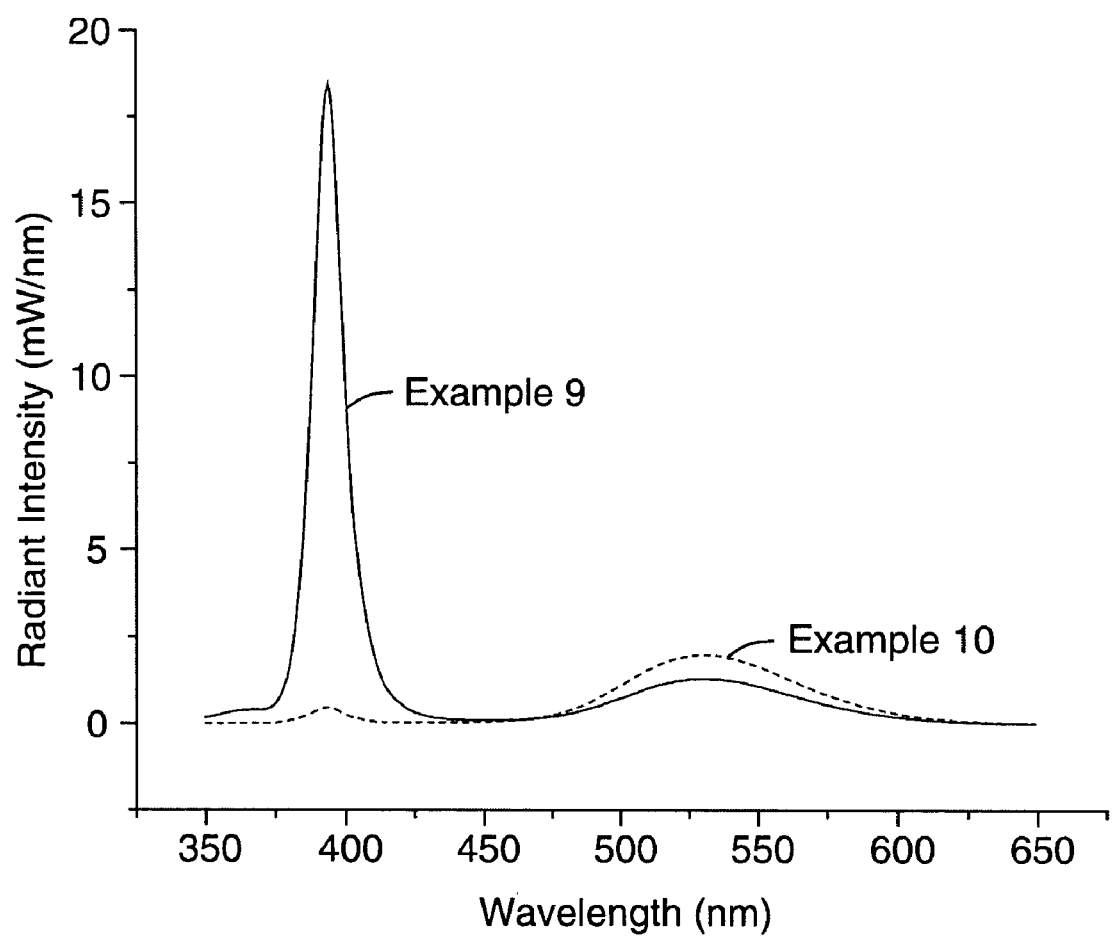
FIG. 25 is a graph of a light intensity spectrum of Examples 9 and 10.

A one inch diameter disk of the ZnS screen printed film from the portion of the pattern having 50% coverage was prepared and mounted into the spectroradiometer as described above. The disk was oriented with the phosphor coated side facing into the integrating sphere. A UV LED (designated Part #25-495 by Hosfelt Electronics, Inc of Steubenville, Ohio) with a peak wavelength of about 395 nm was used to excite the phosphor. The standard 5 mm package for the UV LED was modified by machining off the domed top of the package to provide a flat exit face for the UV light. Approximately 0.180 inches of the package was removed from the top of the package. The LED was powered at 20 milliamps and 3.7 volts by a constant current power supply. The emission spectra of the phosphor layer recorded using the spectroradiometer is shown in FIG. 25 as the curve labeled "Example 9". Using software supplied with the spectroradiometer, the total luminous flux emitted into the integrating sphere was calculated to be 0.052 lumens.

Example 10

A piece of multi-layer optical film (MOF) having alternating layers of PET and co-PMMA and having a normal-incidence reflection band (measured at half-maximum) from about 320 nm to about 490 nm (manufactured by 3M Company of St. Paul, Minn.) was placed in the film adaptor on top of the phosphor layer of Example 9, and the UV LED of Example 9 (operated at 20 milliamps) was used as the excitation source. The spectrum was recorded and is shown in FIG. 25 as the curve labeled "Example 10". Using software supplied with the spectroradiometer, the total luminous flux emitted into the integrating sphere was calculated to be 0.078 lumens. This represents an increase in luminous intensity when compared to Example 9 of about 50%.

Example 11

A thermoformed dome of multilayer optical film (MOF) coated with zinc sulfide (ZnS) phosphor was made by the following procedure.

A layer of MOF having alternating layers of PET and co-PMMA and having a normal-incidence reflection band (measured at half-maximum) from about 590 nm to about 710 nm (manufactured by 3M Company of St. Paul, Minn., USA) was bonded to a sheet of poly (vinyl chloride) to form a flexible composite. This composite will be referred to as MOF-PVC.

The MOF-PVC was placed on a clean flat surface with the MOF side facing up. The top surface of the MOF-PVC was wiped with a lint free cotton cloth dampened with methanol. About 3 grams of the ZnS phosphor paste described in Example 9 was placed onto the MOF-PVC. The phosphor paste was hand-drawn into a coating using the 4 mil gap of a square multiple clearance applicator (designated PAR-5353 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA).

The phosphor coated MOF-PVC composite was loaded into a thermoforming machine. The layer was heated for 23 seconds at a temperature of 270° C. Using a plate with a circular aperture (about ½ inch diameter) the phosphor coated MOF-PVC was formed into a hemisphere of about ½ inch with the phosphor on the convex side of the hemisphere. Visual inspection of the hemisphere indicated the hemisphere had a greater thickness near an outer region of the hemisphere and was thinner at an inner region of the hemisphere. The phosphor layer was smooth and continuous and exhibited no signs of cracking or delamination.

Example 12

A thermoformed dome of multilayer optical film (MOF) coated with zinc sulfide (ZnS) phosphor was made by the following procedure.

A sheet of MOF-PVC described in Example 11 was placed on a clean flat surface with the MOF side facing up. The top surface of the MOF-PVC was wiped with a lint free cotton cloth dampened with methanol. About 3 grams of the ZnS phosphor paste described in Example 9 was placed onto the MOF-PVC. The phosphor paste was hand-drawn into a coating using the 2 mil gap of a square multiple clearance applicator (designated PAR-5353 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA).

The phosphor coated MOF-PVC composite was loaded into a thermoforming machine. The layer was heated for 21 seconds at a temperature of 270° C. Using a plate with a circular aperture (about ½ inch diameter) the phosphor coated MOF-PVC was formed into a hemisphere of about ½ inch with the phosphor on the convex side of the hemisphere. Visual inspection of the hemisphere indicated the hemisphere had a greater thickness near an outer region of the hemisphere and was thinner at an inner region of the hemisphere. The phosphor layer was smooth and continuous and exhibited no signs of cracking or delamination.

Example 13

A thermoformed dome of multilayer optical film (MOF) coated with cerium-doped yttrium aluminum garnet (YAG:Ce) phosphor was made by the following procedure.

20.01 grams of fluoropolymer resin (designated "Phosphor Ink Part A: Resin Solution", part number: 1INR001, rev: AA, batch number: KY4-035 by Durel Corporation of Chandler, Ariz., USA) was placed into a 2 ounce glass jar. 19.98 grams of YAG:Ce phosphor (designated QMK58/F-U1 Lot #13235 by Phosphor Technology, Ltd. of Stevenage, England) was measured into a weighing dish. The phosphor was mixed into the resin by first adding one-half of the phosphor to the resin and mixing it in by hand with a stainless steel spatula and then adding the other half and mixing it by hand. The phosphor and resin were mixed by hand until the mixture had a smooth texture and uniform appearance. The jar containing the resulting phosphor paste was covered with a lid and placed on a bottle roller for about 30 minutes.

A sheet of MOF-PVC described in Example 11 was placed on a clean flat surface with the MOF side facing up. The top surface of the MOF-PVC was wiped with a lint free cotton cloth dampened with methanol. About 3 grams of the YAG:Ce phosphor paste was placed onto the MOF-PVC. The phosphor paste was hand-drawn into a coating using the 4 mil gap of a square multiple clearance applicator (designated PAR-5353 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA).

The phosphor coated MOF-PVC composite was loaded into a thermoforming machine. The layer was heated for 23 seconds at a temperature of 270° C. Using a plate with a circular aperture (about ½ inch diameter) the phosphor coated MOF-PVC was formed into a hemisphere of about ½ inch with the phosphor on the convex side of the hemisphere. Visual inspection of the hemisphere indicated the hemisphere had a greater thickness near an outer region of the hemisphere and was thinner at an inner region of the hemisphere. The phosphor layer was smooth and continuous and exhibited no signs of cracking or delamination.

Example 14

A thermoformed dome of multilayer optical film (MOF) coated with cerium-doped yttrium aluminum garnet (YAG:Ce) phosphor was made by the following procedure.

A sheet of MOF-PVC described in Example 11 was placed on a clean flat surface with the MOF side facing up. The top surface of the MOF-PVC was wiped with a lint free cotton cloth dampened with methanol. About 3 grams of the YAG:Ce phosphor paste described in Example 13 was placed onto the MOF-PVC. The phosphor paste was hand-drawn into a coating using the 2 mil gap of a square multiple clearance applicator (designated PAR-5353 by BYK-Gardner USA of Columbia, Md., USA). The wet film was cured at a temperature of about 130° C. for 30 minutes in a gravity convection oven (designated Model 1350G by VWR International, Inc., of West Chester, Pa., USA).

The phosphor coated MOF-PVC composite was loaded into a thermoforming machine. The layer was heated for 21 seconds at a temperature of 270° C. Using a plate with a circular aperture (about ½ inch diameter) the phosphor coated MOF-PVC was formed into a hemisphere of about ½ inch with the phosphor on the convex side of the hemisphere. Visual inspection of the hemisphere indicated the hemisphere had a greater thickness near an outer region of the hemisphere and was thinner at an inner region of the hemisphere. The phosphor layer was smooth and continuous and exhibited no signs of cracking or delamination.

Example 15

A sheet of MOF-PVC described in Example 11 was heated in the thermoforming device described above to a temperature of about 270° C. for 16 seconds. This heated sheet of MOF-PVC was draped over the hemispherical lens of a commercially available 5 mm LED package with vacuum assist. The MOF-PVC acquired a final shape corresponding to the hemispherical lens shape.

The formed MOF-PVC transmission spectrum was measured using a Perkin-Elmer Lambda 19 spectrophotometer. The spectrum of the central portion of the formed MOF-PVC was shown to have band edges at 360 nm and 460 nm with a peak reflectivity occurring at 400 nm. This formed MOF-PVF had a transmission greater than 75% at wavelengths above 500 nm. This measured spectral shift of the MOF-PVC was due to the thinning of the optical stack occurring during the shaping operation.

All patents and patent applications referenced herein are incorporated by reference in their entirety. Various modifications and alterations of this invention will be apparent to those skilled in the art without departing from the scope and spirit of this invention, and it should be understood that this invention is not limited to the illustrative embodiments set forth herein.

What is claimed is:

1. A light source, comprising:
   an LED that emits excitation light;
   a layer of phosphor material positioned to receive the excitation light, the phosphor material emitting visible light when illuminated with the excitation light; and
   a non-planar polymeric multilayer reflector that reflects the excitation light and transmits visible light, the non-planar polymeric multilayer reflector being positioned to reflect the excitation light onto the phosphor material;
   wherein the non-planar polymeric multilayer reflector has a non-uniform thickness.

2. The light source of claim 1, wherein the non-planar polymeric multilayer reflector comprises alternating layers of a first and second thermoplastic polymer and wherein at least some of the layers are birefringent.

3. The light source of claim 1, wherein the excitation light comprises UV light.

4. The light source of claim 1, wherein the non-planar polymeric multilayer reflector is concave.

5. The light source of claim 1, wherein the non-planar polymeric multilayer reflector is hemispherically concave.

6. The light source of claim 1, wherein the layer of phosphor material is disposed between the LED and the non-planar polymeric multilayer reflector.

7. The light source of claim 1, wherein the non-planar polymeric multilayer reflector has a first thickness at an inner region of the non-planar polymeric multilayer reflector and a second thickness at an outer region of the non-planar polymeric multilayer reflector and the first thickness is different than the second thickness.

8. The light source of claim 7, wherein the first thickness is greater than the second thickness.

9. The light source of claim 7, wherein the first thickness is less than the second thickness.

10. The light source of claim 1, wherein the non-planar polymeric multilayer reflector includes polymeric material that resists degradation when exposed to UV light.

11. The light source of claim 1, wherein the non-planar polymeric multilayer reflector is substantially free of inorganic materials.

12. The light source of claim 1, wherein the layer of phosphor material comprises particles of phosphor material dispersed in a binder.

13. The light source of claim 12, wherein the layer of phosphor material is discontinuous, comprising a plurality of distinct regions.

14. The light source of claim 13, wherein each region has an area of less than 10000 microns$^2$.

15. The light source of claim 13, wherein the regions comprise a first region that emits red light, a second region that emits green light, and a third region that emits blue light, when illuminated with the excitation light.

16. The light source of claim 1, further comprising:
a multilayer reflector that reflects visible light and transmits the excitation light disposed between the LED and the phosphor material.

17. The light source of claim 16, wherein the multilayer reflector comprises polymeric material.

18. The light source of claim 16, wherein the multilayer reflector comprises alternating layers of a first and second thermoplastic polymer and wherein at least some of the layers are birefringent.

19. The light source of claim 16, wherein the non-planar polymeric multilayer reflector is concave.

20. The light source of claim 16, wherein the multilayer reflector is concave and polymeric.

21. The light source of claim 16, wherein the non-planar polymeric multilayer reflector is hemispherically concave.

22. The light source of claim 16, wherein the multilayer reflector is hemispherically concave.

23. The light source of claim 16, wherein the non-planar polymeric multilayer reflector comprises a polymeric material that resists degradation when exposed to UV light and the multilayer reflector comprises a polymeric material that resists degradation when exposed to UV light.

24. The light source of claim 16, wherein the non-planar polymeric multilayer reflector is substantially free of inorganic materials and the multilayer reflector is substantially free of inorganic materials.

25. The light source of claim 16, wherein the non-planar polymeric multilayer reflector is hemispherically concave and the multilayer reflector is hemispherically concave.

26. The light source of claim 25, wherein the layer of phosphor material is disposed between the non-planar polymeric multilayer reflector and the multilayer reflector.

27. The light source of claim 16, wherein the layer of phosphor material comprises particles of phosphor material dispersed in a binder.

28. The light source of claim 27, wherein the layer of phosphor material is discontinuous, comprising a plurality of distinct regions.

29. The light source of claim 28, wherein each region has an area of less than 10000 microns$^2$.

30. The light source of claim 28, wherein the regions comprise a first region that emits red light, a second region that emits green light, and a third region that emits blue light, when illuminated with the excitation light.

31. The light source of claim 28, wherein at least a first region emits light at a first wavelength and a second region emits light at a second wavelength different than the first wavelength.

32. A method of manufacturing a light source, comprising the steps of:
providing an LED that emits excitation light;
positioning a layer of phosphor material such that the phosphor material emits visible light when illuminated with the excitation light; and
positioning a non-planar polymeric multilayer reflector to reflect the excitation light onto the phosphor material and transmit visible light, the non-planar polymeric multilayer reflector having a non-uniform thickness.

33. The method of claim 32, wherein the non-planar polymeric multilayer reflector comprises alternating layers of a first and second thermoplastic polymer and wherein at least some of the layers are birefringent.

34. The method of claim 32, further comprising the step of shaping a polymeric multilayer reflector to form the non-planar polymeric multilayer reflector.

35. The method of claim 32, further comprising the step of thermoforming a polymeric multilayer reflector to form the non-planar polymeric multilayer reflector.

36. The method of claim 32, further comprising the step of patterning the layer of phosphor material so that such layer is discontinuous.

37. A light source, comprising:
an LED that emits excitation light;
a layer of phosphor material positioned to receive the excitation light, the phosphor material emitting visible light when illuminated with the excitation light;
a non-planar polymeric multilayer reflector that reflects the excitation light and transmits visible light, the non-planar polymeric multilayer reflector being positioned to reflect the excitation light onto the phosphor material; and
a multilayer reflector that reflects visible light and transmits the excitation light disposed between the LED and the phosphor material.

38. The light source of claim 37, wherein the multilayer reflector comprises polymeric material.

39. The light source of claim 37, wherein the multilayer reflector comprises alternating layers of a first and second thermoplastic polymer and wherein at least some of the layers are birefringent.

40. The light source of claim 37, wherein the non-planar polymeric multilayer reflector is concave.

41. The light source of claim 37, wherein the multilayer reflector is concave and polymeric.

42. The light source of claim 37, wherein the non-planar polymeric multilayer reflector is hemispherically concave.

43. The light source of claim 37, wherein the multilayer reflector is hemispherically concave.

44. The light source of claim 37, wherein the non-planar polymeric multilayer reflector comprises a polymeric material that resists degradation when exposed to UV light and the multilayer reflector comprises a polymeric material that resists degradation when exposed to UV light.

45. The light source of claim 37, wherein the non-planar polymeric multilayer reflector is substantially free of inorganic materials and the multilayer reflector is substantially free of inorganic materials.

46. The light source of claim 37, wherein the non-planar polymeric multilayer reflector is hemispherically concave and the multilayer reflector is hemispherically concave.

47. The light source of claim 46, wherein the layer of phosphor material is disposed between the first and second non-planar polymeric multilayer reflector and the multilayer reflector.

48. The light source of claim 37, wherein the layer of phosphor material comprises particles of phosphor material dispersed in a binder.

49. The light source of claim 48, wherein the layer of phosphor material is discontinuous, comprising a plurality of distinct regions.

50. The light source of claim 49, wherein each region has an area of less than 10000 microns$^2$.

51. The light source of claim 49, wherein the regions comprise a first region that emits red light, a second region that emits green light, and a third region that emits blue light, when illuminated with the excitation light.

52. The light source of claim 49, wherein at least a first region emits light at a first wavelength and a second region emits light at a second wavelength different than the first wavelength.

53. A method of manufacturing a light source, comprising the steps of:

providing an LED that emits excitation light;

positioning a layer of phosphor material such that the phosphor material emits visible light when illuminated with the excitation light;

positioning a non-planar polymeric multilayer reflector to reflect the excitation light onto the phosphor material and transmit visible light; and positioning a multilayer reflector between the LED and the phosphor material to reflect visible light and transmits the excitation light.

54. The method of claim 53, wherein the non-planar polymeric multilayer reflector comprises alternating layers of a first and second thermoplastic polymer and wherein at least some of the layers are birefringent.

55. The method of claim 53, further comprising the step of shaping a polymeric multilayer reflector to form the non-planar polymeric multilayer reflector.

56. The method of claim 53, further comprising the step of thermoforming a polymeric multilayer reflector to form the non-planar polymeric multilayer reflector.

57. The method of claim 53, further comprising the step of patterning the layer of phosphor material so that such layer is discontinuous.

* * * * *

UNITED STATES PATENT AND TRADEMARK OFFICE
CERTIFICATE OF CORRECTION

PATENT NO. : 7,312,560 B2  Page 1 of 1
APPLICATION NO. : 10/727026
DATED : December 25, 2007
INVENTOR(S) : Andrew J. Ouderkirk It is certified that error appears in the above-identified patent and that said Letters Patent is hereby corrected as shown below:

Column 4
Line 46-47, delete "reflectors" and insert -- reflectors' --, therefor.

Column 8
Line 14, after "light" insert -- . --.

Column 15
Line 26, delete "V," and insert -- UV, --, therefor.
Line 62, delete "miter" and insert -- outer --, therefor.

Column 16
Line 55, delete "schernalic" and insert -- schematic --, therefor.
Line 59, delete "ligbt" and insert -- light --, therefor.
Line 62, after "512" insert -- excitation light --.

Column 17
Line 8, delete "V," and insert -- UV, --, therefor.
Line 65, delete "disposod" and insert -- disposed --, therefor.

Column 18
Line 7, delete "tansparent" and insert -- transparent --, therefor.

Column 28
Line 47, in Claim 47, after "first" delete "and second".

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,312,560 B2 | Page 1 of 1 |
| APPLICATION NO. | : 10/727026 | |
| DATED | : December 25, 2007 | |
| INVENTOR(S) | : Andrew J. Ouderkirk | |

It is certified that error appears in the above-identified patent and that said Letters Patent is hereby corrected as shown below:

Title Page
 After "Item [73] Assignee:", insert -- 3M Innovative Properties Company, St. Paul, Minnesota --.

Signed and Sealed this

Seventeenth Day of February, 2009

JOHN DOLL
*Acting Director of the United States Patent and Trademark Office*